US010082535B2

(12) United States Patent
Mikkola et al.

(10) Patent No.: US 10,082,535 B2
(45) Date of Patent: Sep. 25, 2018

(54) PROGRAMMABLE TEST STRUCTURE FOR CHARACTERIZATION OF INTEGRATED CIRCUIT FABRICATION PROCESSES

(71) Applicant: Ridgetop Group, Inc., Tuscon, AZ (US)

(72) Inventors: Esko O. Mikkola, Tuscon, AZ (US); Hans A. R. Manhaeve, Bruges (BE)

(73) Assignee: Ridgetop Group, Inc., Tucson, AZ (US)

( * ) Notice: Subject to any disclaimer, the term of this patent is extended or adjusted under 35 U.S.C. 154(b) by 264 days.

(21) Appl. No.: 15/008,868

(22) Filed: Jan. 28, 2016

(65) Prior Publication Data

US 2016/0161548 A1 Jun. 9, 2016

Related U.S. Application Data

(63) Continuation-in-part of application No. 13/424,025, filed on Mar. 19, 2012, now Pat. No. 9,275,187.
(Continued)

(51) Int. Cl.
| | |
|---|---|
| *G01R 31/00* | (2006.01) |
| *G01R 31/28* | (2006.01) |
| *H01L 21/66* | (2006.01) |
| *H01L 21/00* | (2006.01) |
| *G01R 1/00* | (2006.01) |

(52) U.S. Cl.
CPC ..... *G01R 31/2818* (2013.01); *G01R 31/2884* (2013.01); *H01L 22/34* (2013.01); *G01R 1/00* (2013.01); *H01L 21/00* (2013.01); *H01L 2221/00* (2013.01)

(58) Field of Classification Search
CPC ........ H01L 21/00; H01L 2221/00; G01R 1/00
See application file for complete search history.

(56) References Cited

U.S. PATENT DOCUMENTS

| | | |
|---|---|---|
| 4,620,282 A | 10/1986 | Shelley |
| 4,907,230 A | 3/1990 | Heller et al. |

(Continued)

OTHER PUBLICATIONS

Keane et al., "An Array-Based Test Circuit for Fully Automated Gate Dielectric Breakdown Characterization," IEEE 2008, Custom Integrated Circuits Conference (CICC), pp. 121-124.
(Continued)

*Primary Examiner* — Jermele M Hollington
*Assistant Examiner* — Temilade Rhodes-Vivour
(74) *Attorney, Agent, or Firm* — Eric A. Gifford

(57) ABSTRACT

A test structure includes a dedicated addressing circuit that allows large numbers of test devices to be tested simultaneously and the measurement signals read out serially for different test devices. The test structure may be configured for wafer, die or package-level testing. The test structure may be integrated on a common die with the test devices in a single package, provided on separate die in a common package, separately packaged chips or in the form of a collection of standard die configured as the test structure. If on separate die, the test and addressing circuitry is fabricated from a more mature fabrication process than that being characterized for the devices under test. The processes being characterized may be unqualified whereas the test circuitry may be fabricated with different and more mature or qualified processes.

26 Claims, 28 Drawing Sheets

Related U.S. Application Data

(60) Provisional application No. 62/186,054, filed on Jun. 29, 2015, provisional application No. 61/465,463, filed on Mar. 21, 2011.

(56) References Cited

U.S. PATENT DOCUMENTS

| | | | |
|---|---|---|---|
| 5,778,004 | A | 7/1998 | Jennion et al. |
| 6,002,426 | A * | 12/1999 | Back ............... H04N 7/181 |
| | | | 348/87 |
| 6,052,197 | A | 4/2000 | Drake |
| 6,087,841 | A * | 7/2000 | Bonaccio ......... G01R 31/043 |
| | | | 324/538 |
| 6,218,205 | B1 | 4/2001 | Michalicek |
| 7,239,163 | B1 | 7/2007 | Ralston-Good et al. |
| 7,271,608 | B1 | 9/2007 | Vermeire et al. |
| 7,366,939 | B2 | 4/2008 | Le et al. |
| 7,437,589 | B2 | 10/2008 | Le et al. |
| 7,496,466 | B2 | 2/2009 | Farkas |
| 7,501,832 | B2 | 3/2009 | Spuhler et al. |
| 7,519,886 | B2 | 4/2009 | Tsao et al. |
| 7,673,197 | B2 | 3/2010 | Luff et al. |
| 7,797,578 | B2 | 9/2010 | Co |
| 7,979,225 | B2 | 7/2011 | Muller et al. |
| 8,937,482 | B1 | 1/2015 | Lemczyk |
| 2005/0193306 | A1 | 9/2005 | Luff et al. |
| 2007/0241068 | A1 | 10/2007 | Pamula et al. |
| 2008/0099762 | A1 * | 5/2008 | Garcia ............. G01R 31/31704 |
| | | | 257/48 |
| 2010/0134133 | A1 * | 6/2010 | Pagani ............ G01R 31/31713 |
| | | | 324/750.3 |
| 2011/0202799 | A1 * | 8/2011 | Pagani ............... G01R 31/3025 |
| | | | 714/27 |
| 2012/0245879 | A1 * | 9/2012 | Mikkola ................ G06F 19/00 |
| | | | 702/117 |
| 2014/0156253 | A1 | 6/2014 | McIlvain et al. |

OTHER PUBLICATIONS

Argawal et al., "A Test Structure for Characterizing Local Device Mismatches," 2006 Symposium on VLSI Circuits Digest of Technical Papers, IEEE.

Pang et al, "Impact of Layout on 90nm CMOS Process Parameter Fluctuations," 2006 Symposium on VLSI Circuits Digest of Technical Papers, IEEE.

Kim et al., "Silicon Odometer: An On-Chip Reliability Monitor for Measuring Frequency Degradation of Digital Circuits," IEEE Journal of Solid-State Circuits, vol. 43, No. 4, Apr. 2008, http://hdl.handle.net/10220/6327, pp. 874-880.

* cited by examiner

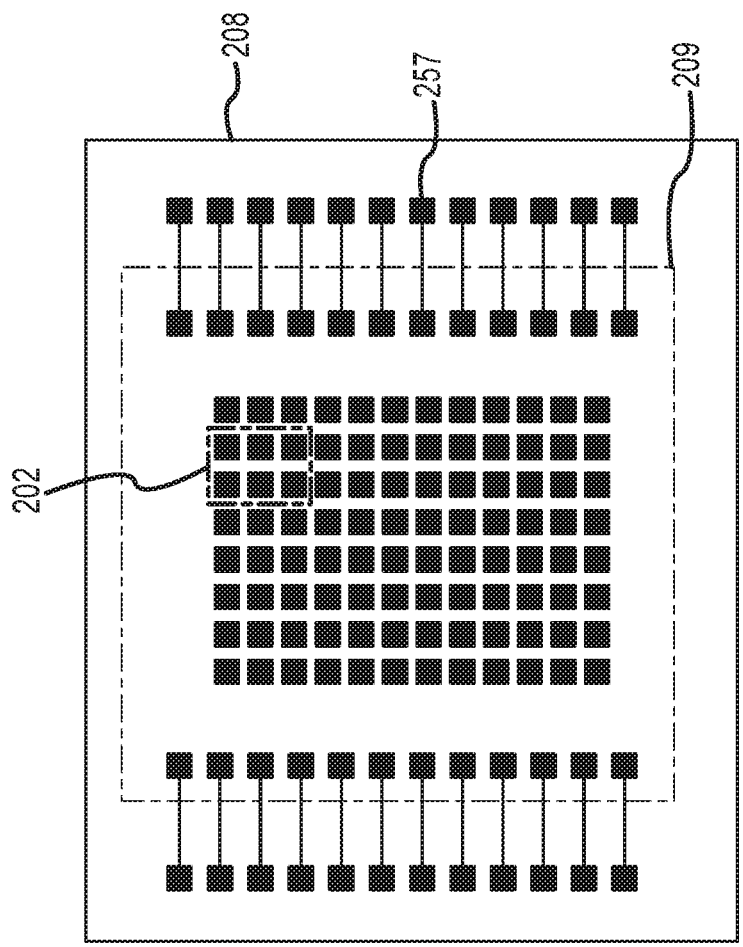
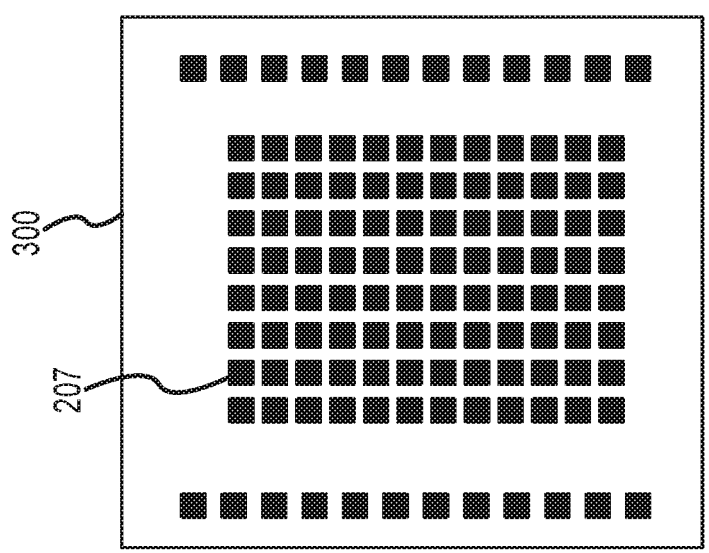
FIG. 17

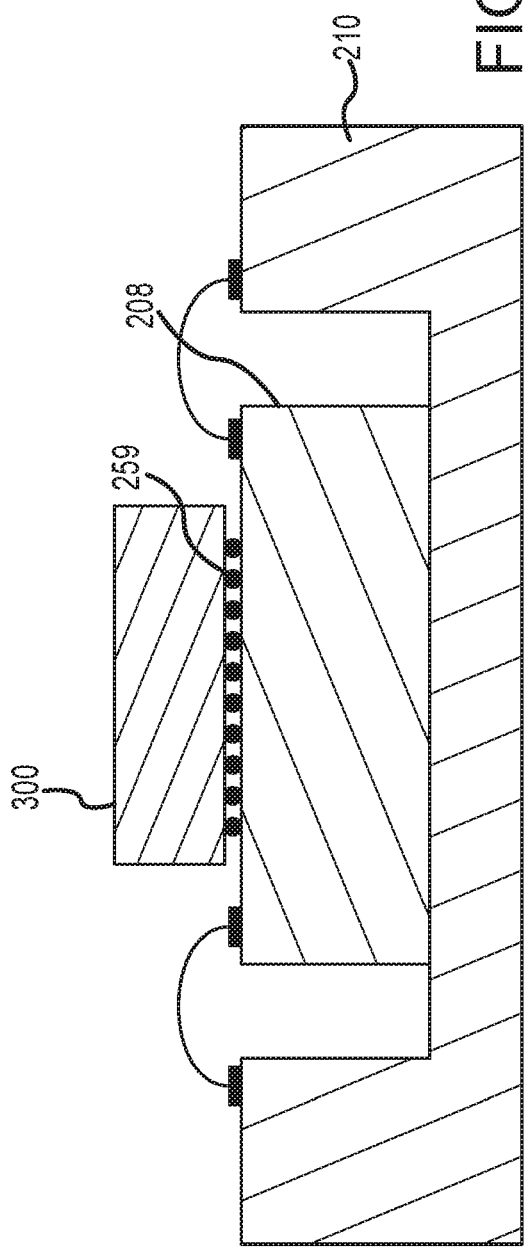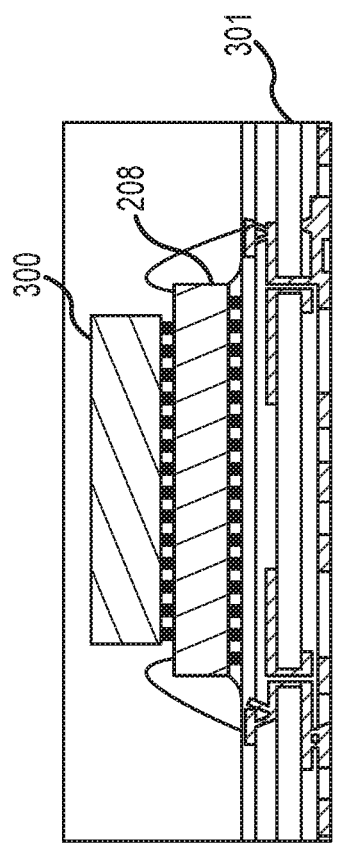

PROGRAMMABLE TEST STRUCTURE FOR CHARACTERIZATION OF INTEGRATED CIRCUIT FABRICATION PROCESSES

CROSS-REFERENCE TO RELATED APPLICATIONS

This application claims benefit of priority under 35 U.S.C. 119(e) to U.S. Provisional Application No. 62/186,054 entitled "Programmable Test Structure, System and Method for Characterization of Integrated Circuit Fabrication Processes" and filed on Jun. 29, 2015 and as a continuation-in-part application under 35 U.S.C 120 to U.S. Utility application Ser. No. 13/424,025 "Programmable Test Chip, System and Method for Characterization of Integrated Circuit Fabrication Processes" and filed on Mar. 19, 2012, which claimed benefit of priority under 35 U.S.C. 119(e) to U.S. Provisional Application No. 61/465,463 entitled "Method and System for Intrinsic Reliability Characterization of Integrated Circuit Fabrication Processes" and filed on Mar. 21, 2011, the entire contents of which are incorporated by reference.

BACKGROUND OF THE INVENTION

Field of the Invention

This invention relates to qualification and reliability characterization of integrated circuit (IC) fabrication processes, and more particularly to a programmable test structure for characterization of process variation and reliability of IC fabrication processes at the wafer, die or package levels.

Description of the Related Art

Increasing the performance of integrated circuits (ICs) requires a complete and accurate characterization of the variation and reliability of available IC fabrication processes. Established processes must be characterized to provide an IC designer with the information required to selected the appropriate process, specify tolerances of component devices, specify circuit performance, reliability and life time. Historically, IC fabrication processes have evolved to create new processes about every 18 months.

Process selection for a new IC product typically starts with an extensive study of initial process variation and device aging unique to that process. Device degradation will accumulate over time and with use and results in a continuous change in the electrical properties of transistors. Modern nanotechnology CMOS circuits have numerous reliability concerns that have to be accounted for during design and verification cycles. The circuits age during the operational life due to effects such as negative and positive bias temperature instabilities (NBTI, PBTI), time-dependent dielectric breakdown (TDDB), stress-induced leakage current (SILC), hot carrier injection (HCI) damage, electro-migration (EM), and stress migration (SM). The varying temperature extremes experienced by circuitry during operation also affects overall reliability and life time performance.

The process of characterizing any given IC fabrication process requires the fabrication of dedicated test devices in that target process. These devices are measurement circuits that are designed to measure device degradation. Electrical and thermal stress is applied to accelerate one or more failure modes. A program for accelerated life testing is then put into action so that the failure mechanisms can be recorded to generate a rate model for a bathtub curve. Failure mechanisms are accelerated by a number of means including the creation of a specific electrical stress bias and/or exposing the device to an extreme thermal environment. But transistors are 3 or 4 port devices and there is no single bias condition that activates all the different aging mechanisms simultaneously. Some failure mechanism are more relevant than others for a given application, so test devices are developed with specific dimensions and stress configurations to emphasis certain types of degradation. Thus, the characterization process is very much tailored to a specific IC fabrication process and product design objective.

In order to have accurate data to characterize process variation and lifetime, a statistically relevant number of devices, perhaps with multiple geometries, for multiple types of devices (e.g. pMOS and nMOS transistors and vias for a CMOS process) must be tested for multiple failure modes. Existing wafer, die and package-level systems subject test devices to a test either one device at a time or in parallel using expensive parallel probes and complex test systems. Package-level systems require multiple packaged test chips, each including a few test devices, in order to tests tens of the devices.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a test structure, system and method for testing large numbers of test devices to characterize an IC fabrication process, decreasing the time and complexity required to characterize the variation and reliability of the IC fabrication process. This is accomplished with a remotely configurable test structure that can be programmed with varying bias conditions for testing of process variation or numerous failure modes on large sample sizes. The test structure comprises test devices combined with test infrastructure circuitry. In its simplest form the test infrastructure circuitry comprises interconnecting means. In more general terms it can comprise interconnecting means, switches, addressing and control logic, signal conditioning and control circuitry. The test devices may be integrated on a single die holding a variety of test devices but may equally be a collection of multiple dies each holding one or more test devices. A dedicated addressing technique allows large numbers of test devices to be tested simultaneously and the measurement signals read out serially for different test devices. The test structure may be configured for wafer, die or package-level testing. The test infrastructure circuitry may be integrated on a common die with the test devices in a single package, provided on a separate die in a common package, provided as a separately packaged chip or be realized in the form of a collection of standard die configured as the test infrastructure circuitry.

In an embodiment, a test structure comprises one or more die fabricated with an IC fabrication process. The one or more die are fabricated with a plurality of test devices also denominated as devices under test (DUTs), each DUT including a test device having one or more terminals. One or more switch blocks are coupled to each DUT. Each switch block includes a measurement switch coupled between one of the terminals and a measurement contact that provides access for off-chip analog current or voltage meters to the device terminal. Each switch block may include a second measurement switch coupled between the same terminal and a different measurement contact to measure a bias condition at the terminal for purposes of calibration. Each switch block may also include one or more stress switches coupled between the same terminal and different stress contacts to receive bias signals from off-chip analog or current sources. Local resistive heating elements may be fabricated on the die to provide localized heating to accelerate degradation. An addressing circuit couples addressing contacts to the DUT switch blocks to selectively apply stress to groups of test devices and pass one or more measurement signals for a selected test device to the one or more of the measurement contacts for a sequence of different selected test devices. The addressing circuit may comprise single or dual serial registers or line decoders, for example.

In an embodiment, a method of characterizing IC fabrication process comprises providing a test structure, connecting off-chip analog current or voltage sources and analog current or voltage meters to one or more of the measurement contacts of the structure and applying a sequence of digital measurement selection commands for the plurality of DUTs to one or more addressing contacts on the test structure to control the DUT switch block measurement switches to selectively bias and pass one or more measurement signals for a selected test device through the one or more of the measurement contacts to the current or voltage meters for a sequence of different selected test devices. The method may also include controlling DUT switch block stress switches to selectively apply bias from off-chip analog sources to stress one or more groups of test devices.

In an embodiment, a system for characterization of an IC fabrication process comprises a test structure, a host controller configured to display a user interface for selection of test modes and specification of test conditions to define a test procedure and to display test data from the test procedure, and a benchtop tester for executing the test procedure on the test structure. The benchtop tester includes programmable voltage and current stress sources, programmable voltage and current measurement sources, voltage and current meters, and an addressing circuit arranged in a universal interface, an adaptor having an input interface that mates with the universal interface and an output interface that mates with the common sets of contacts on the test structure, and one or more controllers responsive to the selected test modes and specified test conditions to program the sources and to control the addressing circuit to applying a sequence of digital measurement selection commands to the test structure.

In different realization forms, the test structure can be but is not limited to one of the following:

A single test chip, integrating DUTs and test infrastructure circuitry (TIC) comprising among others of switches, addressing and control logic on a single die, all structures are fabricated with the IC process to be characterized, A combination of multiple dies, fabricated in at least two distinct IC processes, that are connected together to form the test structure. At least one test device die contains the DUT structures and at least one test circuit die contains the TIC. All die are put in the same package. The test device die with DUT structures are fabricated with the IC process to be characterized and possibly qualified whereas the test circuit die with test infrastructure circuitry, generally denominated as "TSIC" for TeSt Infrastructure IC, are fabricated using one or more mature and possibly qualified IC processes, DUT structures being part of a test device die that is still residing on a wafer (prior to cutting and dicing) or that are forming scribe line test structures. The DUT structures are connected to through probe pads or probe needles that are part of a probe card and are combined with switches and addressing and control logic (on test circuit die) that resides on the probe card or on a dedicated adapter board that forms the interface between the probe card and the test system. The wafer is fabricated with the IC process to be characterized and possibly qualified whereas the switches and address control logic on the test circuit die are fabricated with mature and possibly qualified IC processes, and One or more packaged test device die that each hold one or more DUT structures, that are combined on an adapter board that also holds switches, addressing and control logic situated in one or more test circuit die. The packaged test device die are fabricated with the IC process to be characterized and possibly qualified whereas the switches and address control logic on the test circuit die are fabricated with mature and possibly qualified IC processes.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 17 is a diagram of a DUT die fabricated with an IC process to be characterized and possibly qualified and a TSIC including test circuitry fabricated with a mature and possibly qualified IC process;

FIGS. 18a and 18b are diagrams of the TSIC flip-chip mounted on the DUT die in a single package or as a direct mount on a carrier;

DETAILED DESCRIPTION OF THE INVENTION

The present invention provides a test structure, system and method for testing large numbers of test devices on a single test structure to characterize an IC fabrication process, decreasing the time and complexity required to characterize the variation and reliability of the IC fabrication process. This is accomplished with a remotely configurable test structure that can be programmed with varying bias conditions for testing of process variation or numerous failure modes on large sample sizes.

The test structure can be a single test chip with all functionality integrated on a single die within a single package, a combination of one or more test chips containing only DUT structures with a second chip containing test infrastructure circuitry (switches, control and addressing logic) either combined in a single package or separately packaged and combined on an adapter board or combined as naked die on an adapter board, a combination of test devices residing on a wafer with a probing means to contact the test devices and test infrastructure circuitry either being integrated on a single chip or built from off-the-shelf components or a combination thereof, or a combination of one or more test chips containing DUT structures with test infrastructure circuitry either being integrated on a single chip or built from off-the-shelf components or a combination thereof. In some embodiments, both the DUT and test circuitry are fabricated from the IC fabrication process to be characterized and possibly qualified. In other embodiments, the test circuitry is fabricated from a more mature and possibly qualified IC fabrication process(es) or is realized using off-the-shelf components. The proper combination of DUT structures with a suitable addressing technique allows large numbers of test devices to be tested simultaneously and the measurement signals read out serially for different test devices. The test chip may be configured for wafer, die or package-level testing. Without loss of generality, embodiments of the test chip will be described for package-level testing. The term "contact" may be used to refer to contact pads on the die or the external pins of the package.

Figure 1:
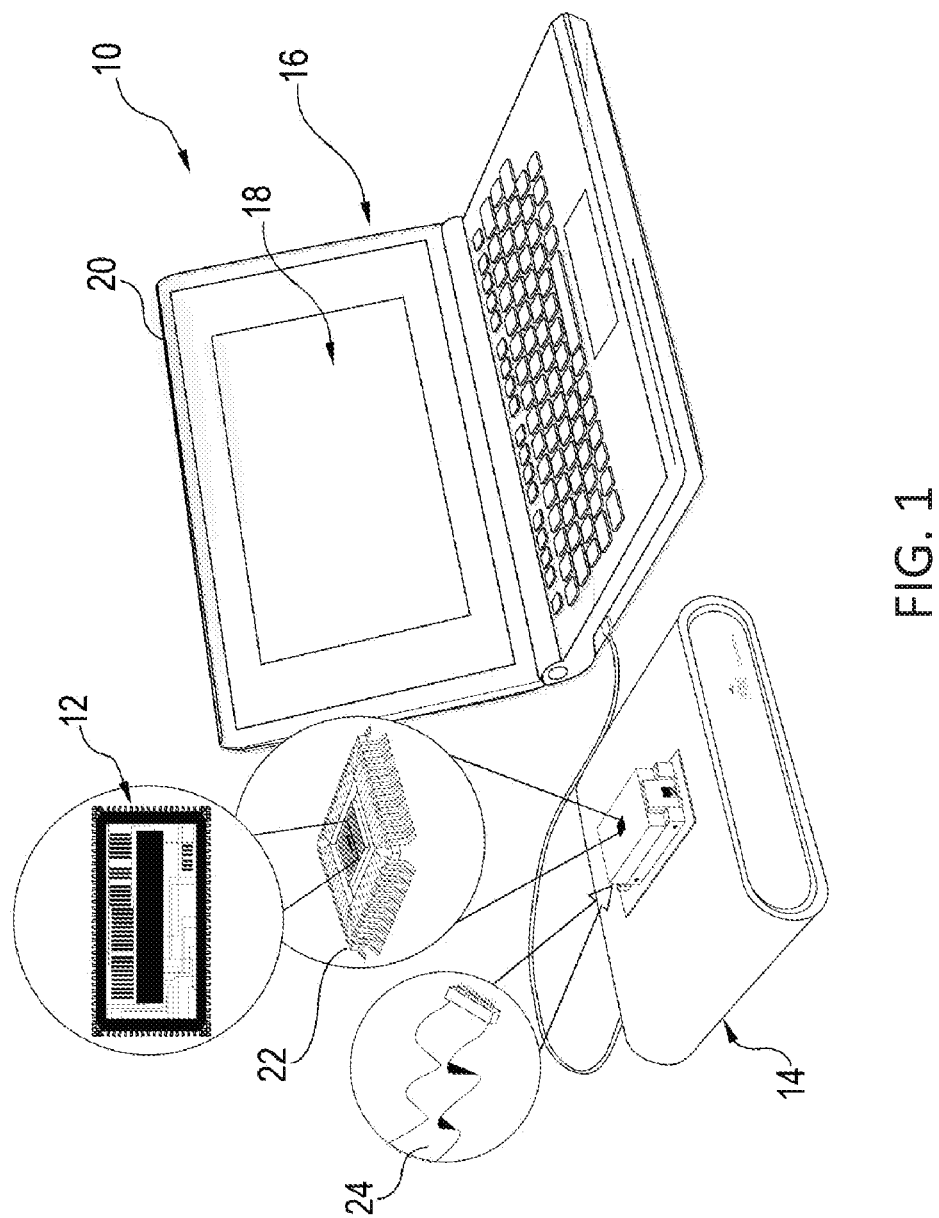
FIG. 1 is a diagram of an embodiment of a system including a host computer, a benchtop tester and a test chip.

Referring now to FIG. 1, a test system 10 includes a test chip 12, a benchtop tester 14 and a host controller 16. In this embodiment, the DUT structures and test circuitry are integrated on a single die within a package. The system is constructed hierarchically starting at a graphic user interface (GUI) 18 running on a host computer 20 to provide host controller 16 and going down to the test device level. Down to the benchtop tester, the elements of this system are universal and can be applied to any purpose without additional customization. The test chip includes standardized test devices, switch blocks, logic blocks (depending upon the addressing scheme) and possibly local heaters that are portable. After the test chip is generated once on a given foundry process, it is standard for that process. Different applications may require looking at different failure and aging modes, but all this can be accomplished using the same test chip. Thus, the test chip can be repeatedly copied and used for any purpose or qualification test objective thereafter, as long as it is targeted to that one process.

Test chip 12 comprises a die fabricated with an IC fabrication process. The die is fabricated with a plurality of devices under test (DUTs), each DUT including a test device having one or more terminals and one or more switch blocks. Each switch block includes a measurement switch coupled between one of the terminals and a measurement contact that provides access for off-chip analog current or voltage meters to the device terminal. Each switch block may include a second measurement switch coupled between the same terminal and a different measurement contact to measure a bias condition at the terminal for purposes of calibration. Each switch block may also include one or more stress switches coupled between the same terminal and different stress contacts to receive bias signals from off-chip analog or current sources. Stress is applied to and measurement made from all the DUTs through common sets of stress and measurement contacts. Local resistive heating elements may be fabricated on the die to provide localized heating to accelerate degradation. An addressing circuit on the die couples a common set of addressing contacts to the DUT switch blocks to selectively apply stress to groups of test devices (if applicable) and pass one or more measurement signals for a selected test device to the one or more of the measurement contacts for a sequence of different selected test devices. These measurement signals may provide process variation or degradation for a large sample of test devices. The addressing circuit may comprise single or dual serial registers or line decoders, for example. All of the circuits on the die except the test devices, including the addressing circuitry, switch blocks and logic blocks are fabricated from higher voltage rated transistors than the test devices in the IC fabrication process so that these circuits do not degrade and affect the test results. In this embodiment, the die is packaged to form a packaged test chip having a plurality of external pins that are connected to respective contacts on the die.

Benchtop tester 14 is a specially designed tester instrument with hardware that is used to perform the tests on the DUTs on the test chip. Benchtop tester 14 contains a programmable controller (e.g. one or more microcontrollers or FPGAs) residing on a main board and one or more plug-in daughter cards that contain components that are needed for the generation of the bias voltages and currents (programmable voltage and current sources) and for measuring currents and voltages (current and volt meters) indicative of process variation or degradation. Tester includes an adapter having an input interface that mates with a universal benchtop interface and an output interface that mates with the test chip. For a packed test chip, the adapter may be an interface card 22 having externals pins that plug into a socket in the tester or may be a cable assembly 24 having a connector that connects to a mating connector on the tester. The cable assembly may be useful if, for example, the test chip is placed in an environmental chamber (e.g. radiation exposure) for testing. For wafer or die-level testing, the adapter will interface to a probe station to contact the contact pads on the die. The probes will, however, only need to be contacted to the pads once to perform all of the tests on all of the DUTs. The tester's programmable controller controls test chip 12 and interfaces with host controller 16. The controller is common to all processes and is compatible with all specific test chips. All control functions and measurement processes are moved out of the test chip and into the benchtop tester.

Host controller 16 comprises host computer 20 configured with a software application to control a GUI 18, to communicate with benchtop tester 14 and to process data. Host controller 16 controls the benchtop tester. In other embodiments, the host controller and benchtop tester may be combined in an integrated tester. Host controller 16 provides control and configurability of the test chip, an interface between a human user and the test data and the capability to process the measurement data into a more useful format such as process variation or lifetime estimates. The host controller communicates to the programmable controller on the benchtop tester what tests to run, the test conditions and DUTs to be tested. All the monitoring objectives are set up by the host controller through, for instance, GUI 18.

The host controller 16 is suitably attached to the benchtop tester by a serial bus interface. Data communication is asynchronous, e.g. RS-485 or USB 2.0. But it could also be RF, GPIB 488, Ethernet, Etc. Communication between the benchtop tester and the test chip is more direct. In an embodiment, an asynchronously clocked serial data line(s) is used to control hundreds or thousands of DUTs simultaneously on the chip. In another embodiment, an asynchronously clocked line decoder(s) may be used to control the DUTs. The communication between the benchtop tester and the test chip is analog for the stress current and voltage waveforms and the measurement signals. The one or more measurement signals are generated in sequence on the test chip for different DUTs and read out through one or more measurement pins. In this manner, a large number of DUTs may be addressed and tested on a single packaged test chip through a limited number of addressing, stress and measurement pins. The number of DUTs test may far exceed the number of pins on the packaged test chip.

Figure 2A:
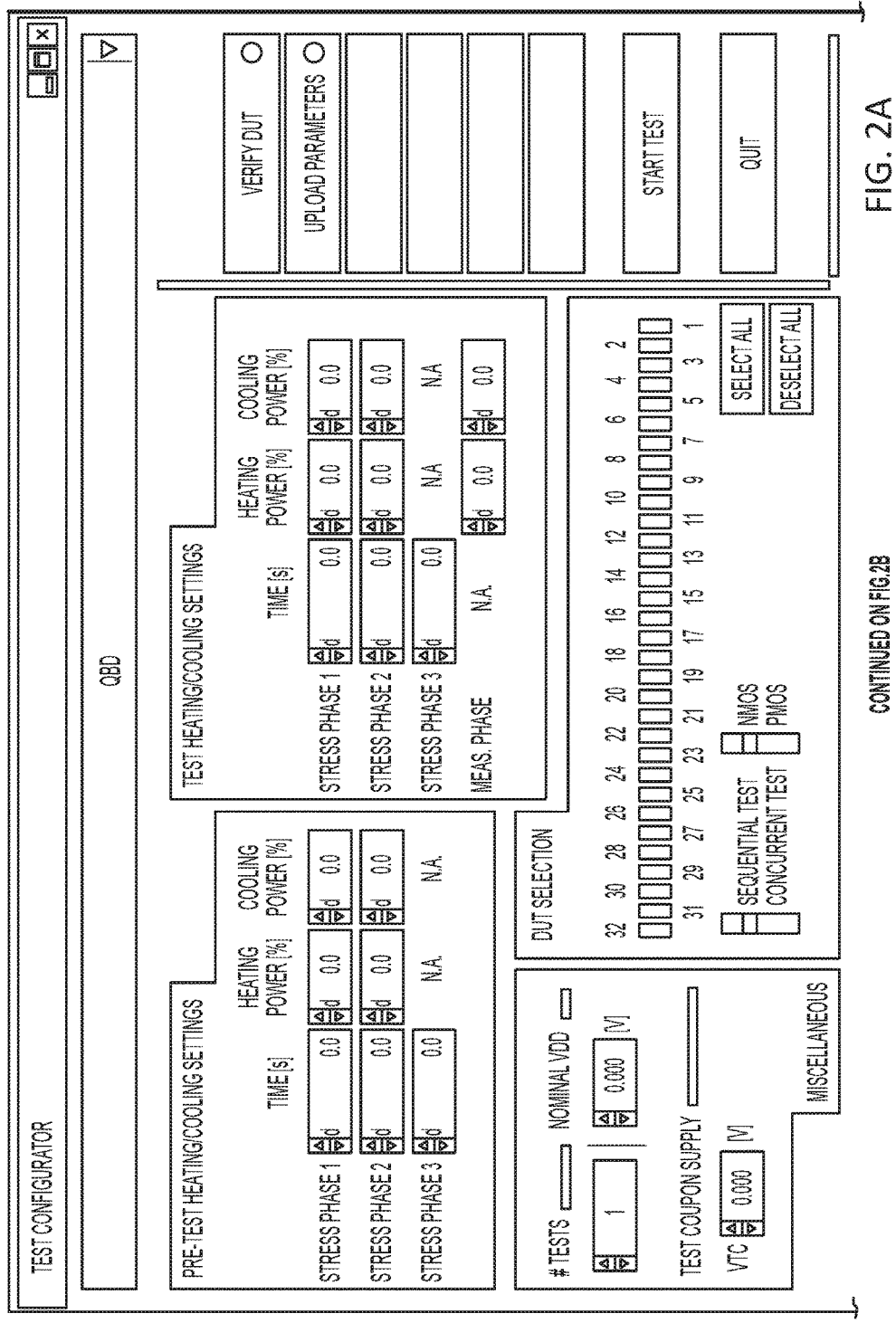
FIGS. 2a and 2b are taken together a diagram of a graphic user interface for selection of tests and specification of test conditions.
Figure 2B:
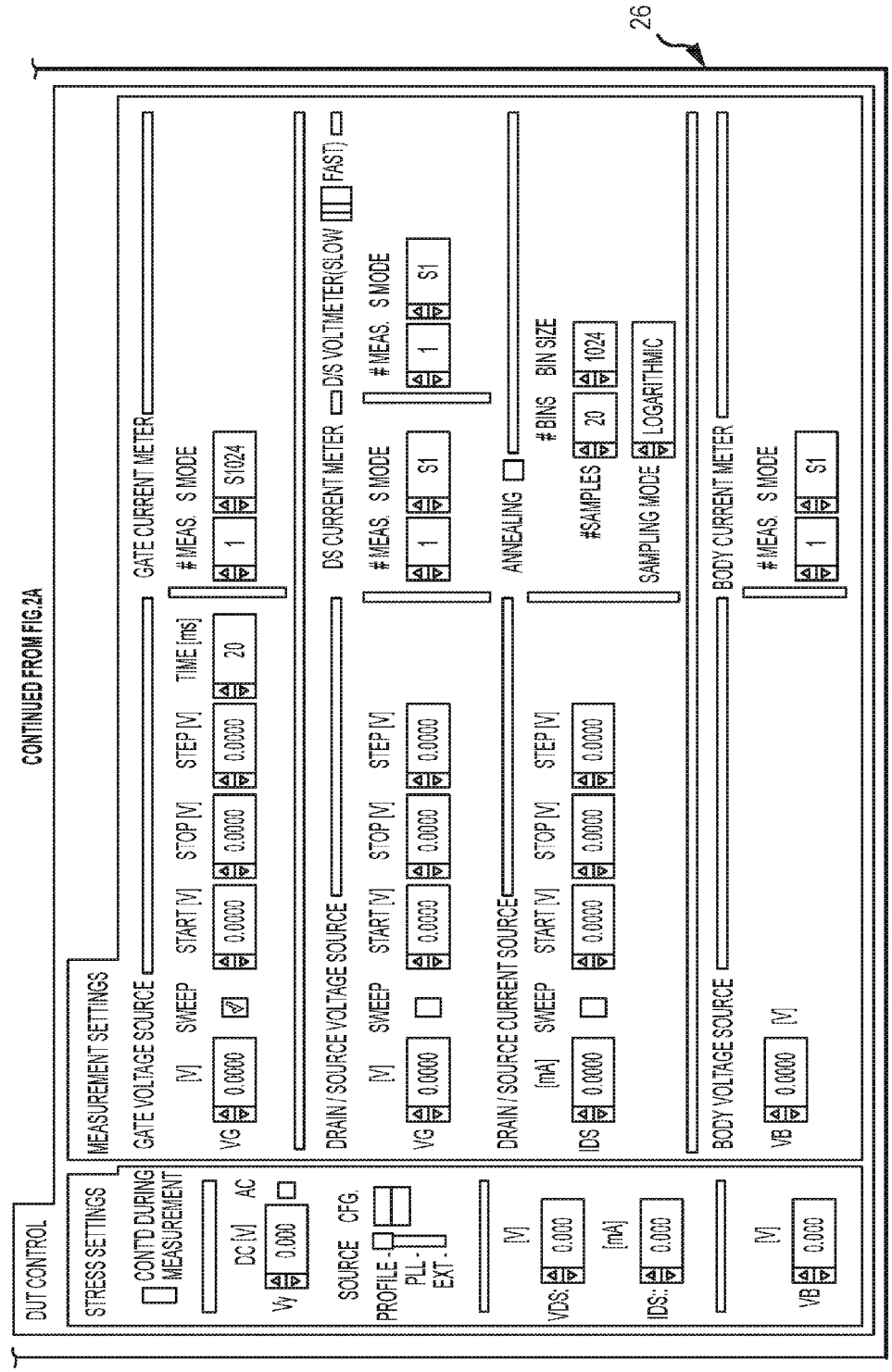

An exemplary test control panel 26 for GUI 18 is shown in FIGS. 2a and 2b. This particular panel is created for the charge to break down (QBD) tests for NMOS and PMOS DUTs. The control panel allows the user to select the test voltages, currents, temperature and other needed parameters for "Stress Settings" and "Measurement Settings" with "DUT Control" and to select the DUT arrays that will be subjected to the test as well as the individual DUTs that will be measured during the test "DUT Selection". The GUI also facilitates specification of Pre-Test and Test "Heating/Cooling Settings". DUTs may be grouped into linear "arrays" to facilitate testing. For example, PMOS transistors, NMOS transistors and vias used to conduct current between different metal layers in an IC may be formed into three separate arrays. Each of these may be further separated into additional arrays for testing different failure modes or for different geometries of the test devices.

Figure 3:
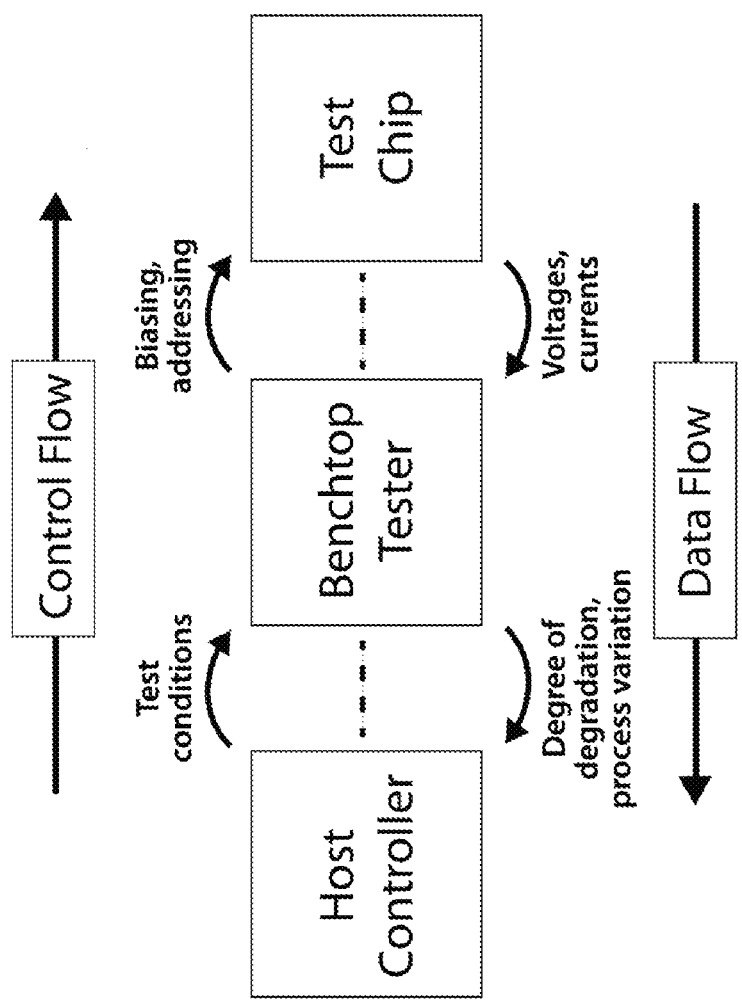
FIG. 3 is a control flow and data flow diagram between system components.

The control flow and data flow between host controller 16, benchtop tester 14 and test chip 12 is illustrated in FIG. 3. The tests to be performed, test conditions, DUTs tested and DUTs measured are passed from the host controller to the benchtop tester. The tester formats this information into a sequence of biasing signals and addressing selection commands that are applied to the stress and measurement pins and addressing pins of the test chip. The test chip applies the same or different stress conditions (if specified) to one or more arrays of DUTs and selectively passes one or more measurement signals (e.g. voltages, currents) from a selected DUT through measurement pins back to the benchtop tester for a sequence of different selected test devices. Typically, the host will specify a test procedure in which the first test is to measure one or more data parameters without stress in order to compute process variation. Thereafter, the test procedure will specify different tests of degradation mechanisms over time to assess reliability. The benchtop tester may return raw data to the host controller or an external memory such as USB memory stick or SD memory card or may have stored the data internally at first for post-test offloading to the host controller. Alternately, the tester may perform some amount of processing on the data to provide measures of process variation or device degradation for a particular test.

In an embodiment, information related to the process or test chip may be electronically stored on the test chip and electronically polled by the benchtop tester. This data would be hardwired and permanently stored in binary format and encoded, for example, by customization of one of the metal mask layers. This information can be accessed by the benchtop tester to identify the process being tested and other configuration information that is stored on the test chip such as tests to run, test conditions, DUTs to stress and DUTs to measure. The host controller and benchtop tester may also write information to the memory to specify test information such as tests completed and DUTs tested. In general, once DUTs are stressed, hence degraded to perform a particular test they are not reused.

Figure 4:
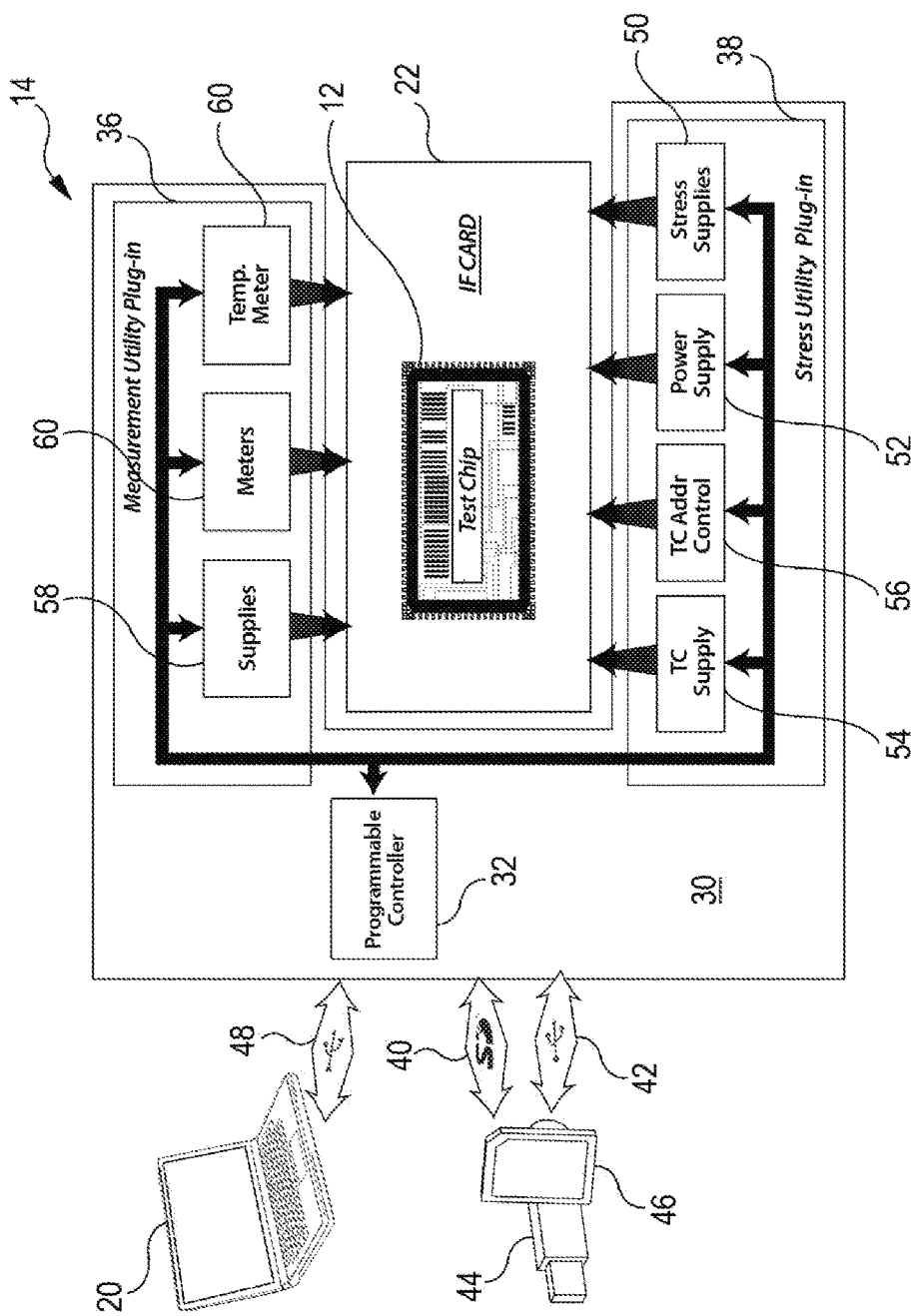
FIG. 4 is a block diagram of an embodiment of the benchtop tester.

As shown in FIG. 4, an embodiment of benchtop tester 14 contains a main card 30 with a programmable controller 32 (e.g. one or more microcontrollers or FPGAs), and three daughter cards including test chip interface card 22, a measurement utility plug-in card 36 and a stress utility plug-in card 38. The main card holds programmable controller 32 and sockets 40 and 42 to external USB memory sticks 44 and SD memory cards 46, respectively, and a USB interface 48 to host computer 20. When these external memories are used the benchtop tester does not need to be connected to the host during the test. The main card also includes an analog-to-digital (ADC) converter to convert measurement signals to digital data. Stress card 38 holds programmable stress supplies (analog voltage and current sources) 50 that are specific for providing stress waveforms to the test chip. Card 38 also includes a power supply 52 for delivering power to local heaters on the test chip to accelerate degradation. The power supply may be capable of providing either DC current or pulse width modulated (PWM) for heating. Card 38 also includes a test chip supply 54 to provide power to the test chip and addressing control 56 to format the addressing selection commands for the test chip. Measurement card 36 holds programmable measurement supplies (voltage and current sources) 58, and analog meters (voltage and current meters) 60 that are needed in the different parameter measurements and temperature meters 62 to measure the localized temperature of the DUTs and DUT arrays. The measurement sources and meters may be hybrid components capable of both sourcing and measuring. For example, a source may force voltage and measure current or force current and measure voltage. For the greatest capability, each measurement pin is preferably capable of both source and measurement. The various supplies, meters and addressing control of the stress and measurement boards are arranged in a universal interface for all test chips and processes.

Interface card 22 has a universal input interface that mates with the benchtop tester's universal interface (e.g. standardized pin out) and an output interface (e.g. socket or contact pads) that mates with the pin out of a particular test chip. The card's output interface connects supply 54 to the supply pins on the test chip, addressing control 56 to a first common set of addressing pins on the test chip, the measurement supplies 58 and meters 60 to a second common set of measurement pins on the test chip and the stress supplies 50 to a third common set of stress pins on the test chip. Other stress supplies 50 may be connected to a fourth common set of stress pins to allow for simultaneous stressing of different DUT arrays under different bias conditions. A different interface card 22 may or may not be required for test chips associated with different processes. The test chip 12 is attached to the interface card 22 by placement inside a re-usable non-permanent chip socket, or directly soldered onto contact pads on the card.

The on-chip addressing technique allows large numbers of test devices to be tested simultaneously and the measurement signals read out serially for different test devices. An addressing circuit on the die couples a common set of addressing contacts to the DUT switch blocks. The addressing circuit may comprise single or dual serial registers or line decoders, for example. The benchtop tester's addressing control applies a sequence of digital measurement selection commands for the plurality of DUTs to one or more addressing contacts to control the DUT switch block stress switches to selectively bias a group of test devices and to control the DUT switch block measurement switches to selectively bias and pass one or more measurement signals for a selected test device through the one or more of the measurement contacts to the benchtop tester's current or voltage meters for a sequence of different selected test devices. In this manner, a large number of DUTs may be addressed and tested on a single packaged test chip through a limited number of addressing, stress and measurement pins. The number of DUTs test may far exceed the number of pins on the packaged test chip.

Figure 5A:
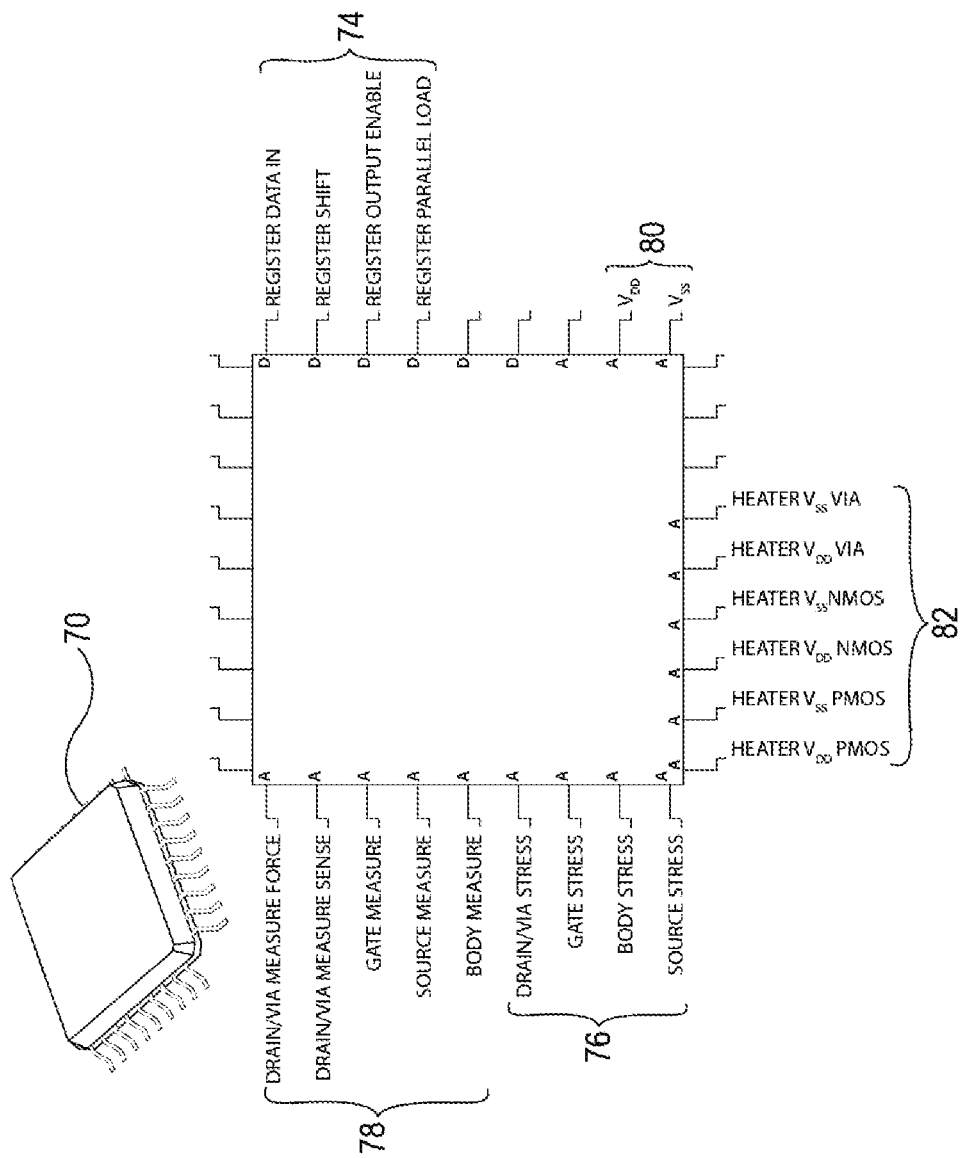
FIGS. 5a and 5b are diagrams of the external pin out and registers for an embodiment using a single serial register to address DUTs.
Figure 5B:
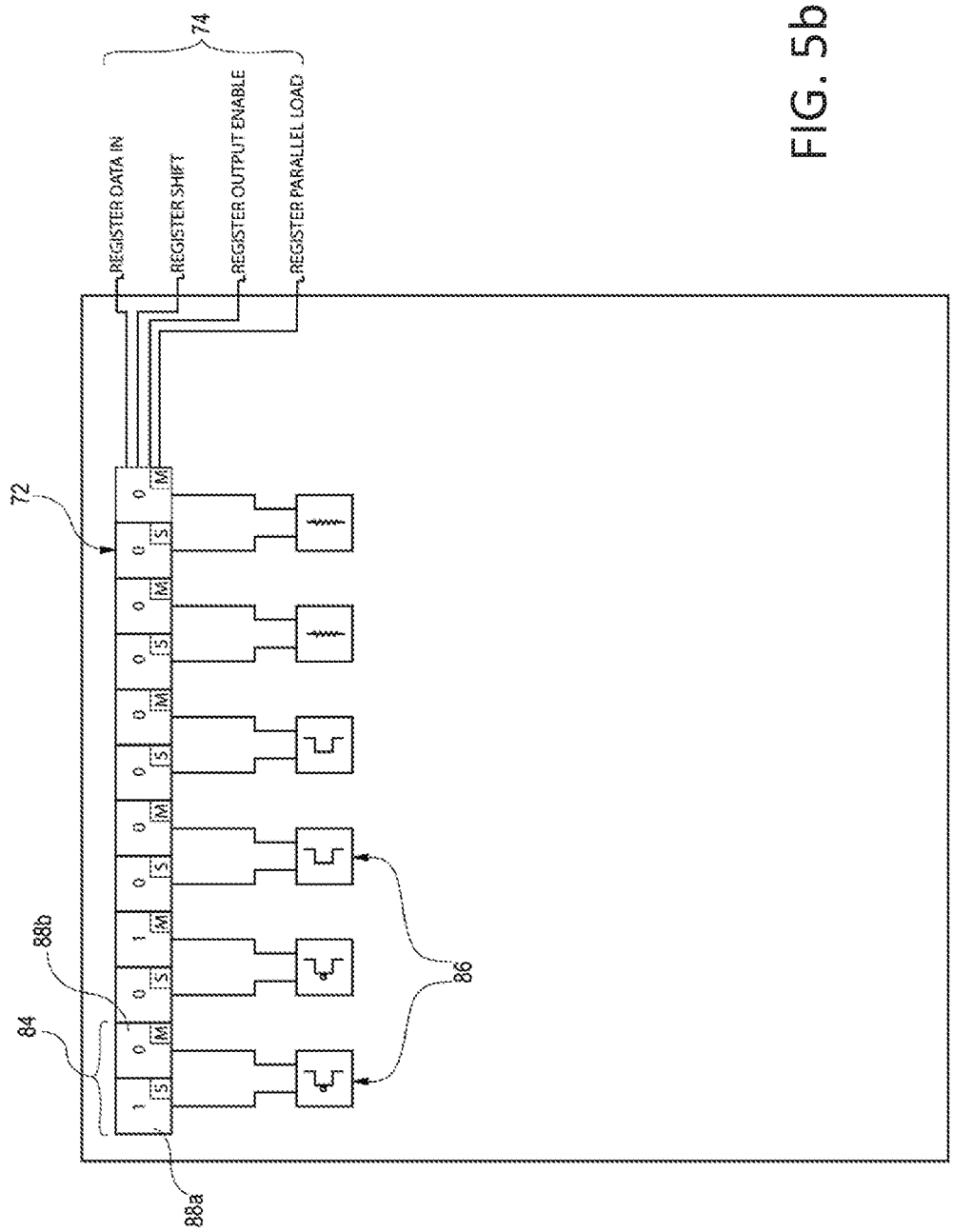

An embodiment of a packaged test chip 70 and implementation of the addressing circuit with a single serial register 72 is illustrated in FIGS. 5a-5b. The package pins that are connected to digital control signals on the benchtop tester are labeled with "D". A common set 74 of digital pins (REGISTER DATA IN, REGISTER SHIFT, REGISTER OUTPUT ENABLE, REGISTER PARALLEL LOAD) together pass the serial digital control bits from the benchtop tester onto the test chip. The actual selection commands (data) is input on the single REGISTER DATA IN pin for all of the DUTs. The other digital pins are used to get the selection commands (data) loaded into the serial register. The package pins that are connected to analog voltage or current sources or meters on the benchtop tester are labeled with "A". A common set 76 of analog pins pass the analog stress bias currents or voltages generated on the benchtop tester daughter cards onto the packaged test chip. A common set 78 of analog pins pass the analog measurement bias currents or voltages generated on the benchtop tester daughter cards onto the packaged test chip. Some of these analog pins also connect the measurement devices, i.e. volt or current meters, placed on the benchtop tester measurement utility plug-in daughter card, onto the chip. VDD and VSS pins 80 are used to connect power supply and ground to the test chip. Heater VDD and VSS pins 82 are used to power up the local degradation accelerating heaters that are surrounding the DUTs. There are separate Heater VDD and VSS pins for every DUT array.

Serial register 72 includes a number of cells 84 equal to the number of DUTs 86 on the die. Each cell 84 includes a stress "S" sub-cell 88a and a measurement "M" sub-cell 88b. Each cell 84 is connected to a different DUT 86, and more particularly to its one or more switch blocks. The binary value in S sub-cell 88a is coupled to the control input of the stress switch in each of the one or more switch blocks. The binary value in M sub-cell 88b is coupled to the control input of the measurement switch in each of the one or more switch blocks. In an embodiment, the serial register includes a shift register and a storage register. The values in these cells, and sub-cells can be changed by shifting new data in serially into the shift register from the REGISTER DATA IN pin. The data is clocked into the shift register with the REGISTER SHIFT signal, loaded in parallel into the storage register with the REGISTER PARALLEL IN signal and enabled for application to the DUTs with the REGISTER OUTPUT ENABLE. The "new data" corresponds to the next entry in a sequence of digital stress and measurement selection commands for the plurality of DUTs. The sequence of data that is shifted into the registers is generated in the benchtop tester instrument that is controlled by the GUI.

A single serial register implementation of the addressing circuit provides the greatest flexibility to apply the stress from a common set of sources to any combination of the DUTs 86 simultaneously. The measurement is normally done one DUT at a time, but it is possible to select multiple DUTs for measurement simultaneously in which case the DUTs would be connected in parallel at the measurement contact. This would be useful, for example, when trying to measure small leakage currents the magnitude of which is so small that a leakage current from just a single transistor cannot be measured accurately with the benchtop tester. The disadvantage of this approach is that as the number of DUTs runs into the thousands the length of the single serial register, hence the time to shift new data into the shift register grows.

Figure 6:
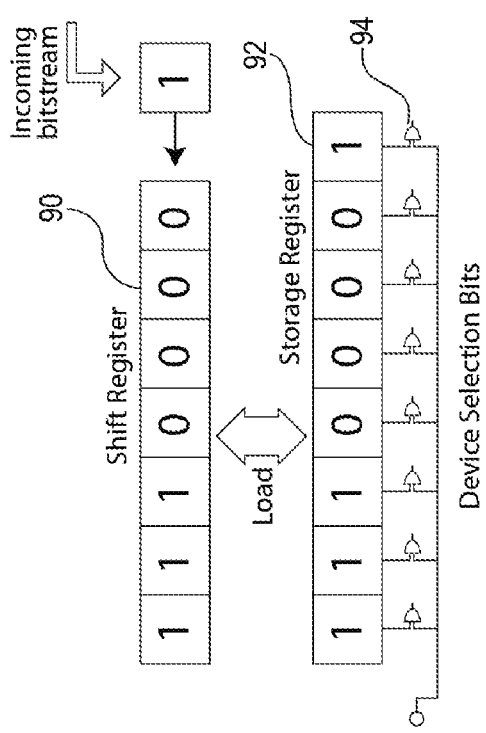
FIG. 6 is a diagram of an embodiment of a serial register.

FIG. 6 illustrates an embodiment for implementing the serial register. An incoming bit stream from the benchtop tester at REGISTER DATA IN can be shifted into a shift register 90 under the control of a clocking signal at REGISTER SHIFT. Once the data is shifted into the shift register 90, the data is loaded in parallel into a storage register 92 under the control of a signal at REGISTER PARALLEL LOAD. Once loaded, the storage registered is enabled as a selection signal to the DUTs by using a standard logic AND gate 94 and setting the REGISTER OUTPUT ENABLE high. The data in storage register 92 that is used to control DUTs does not change as new data is shifted in to shift register 90. This functionality allows performing measurements on some DUTs, while other DUTs are under stress conditions. An alternate embodiment, uses a single register. The OUTPUT ENABLE is switched low while data is shifted into the register and then switched high. This provides a simpler register configuration without the need for PARALLEL LOAD. The tradeoff is that testing is suspended during the period of time data is being shifted into the register.

Figure 7A:
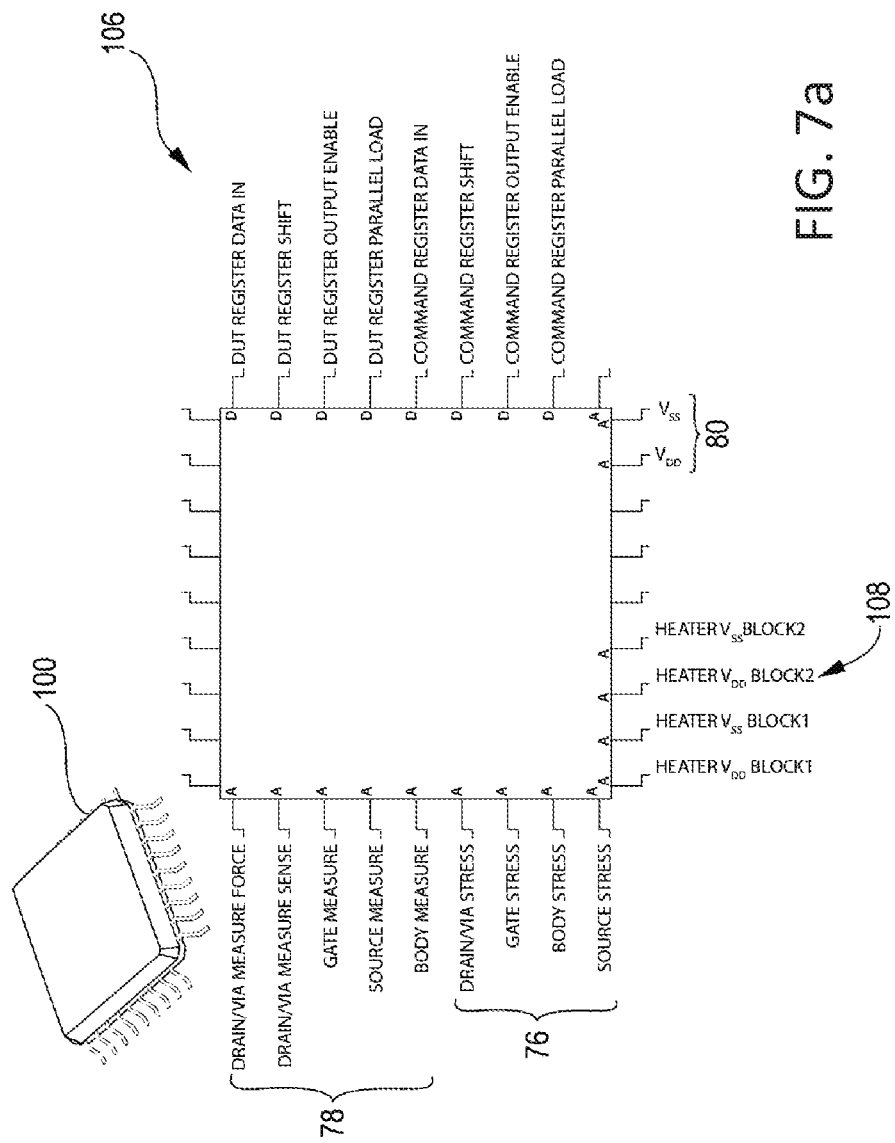
FIGS. 7a and 7b are diagrams of the external pin out and registers for an embodiment using a dual serial register to address DUTs.
Figure 7B:
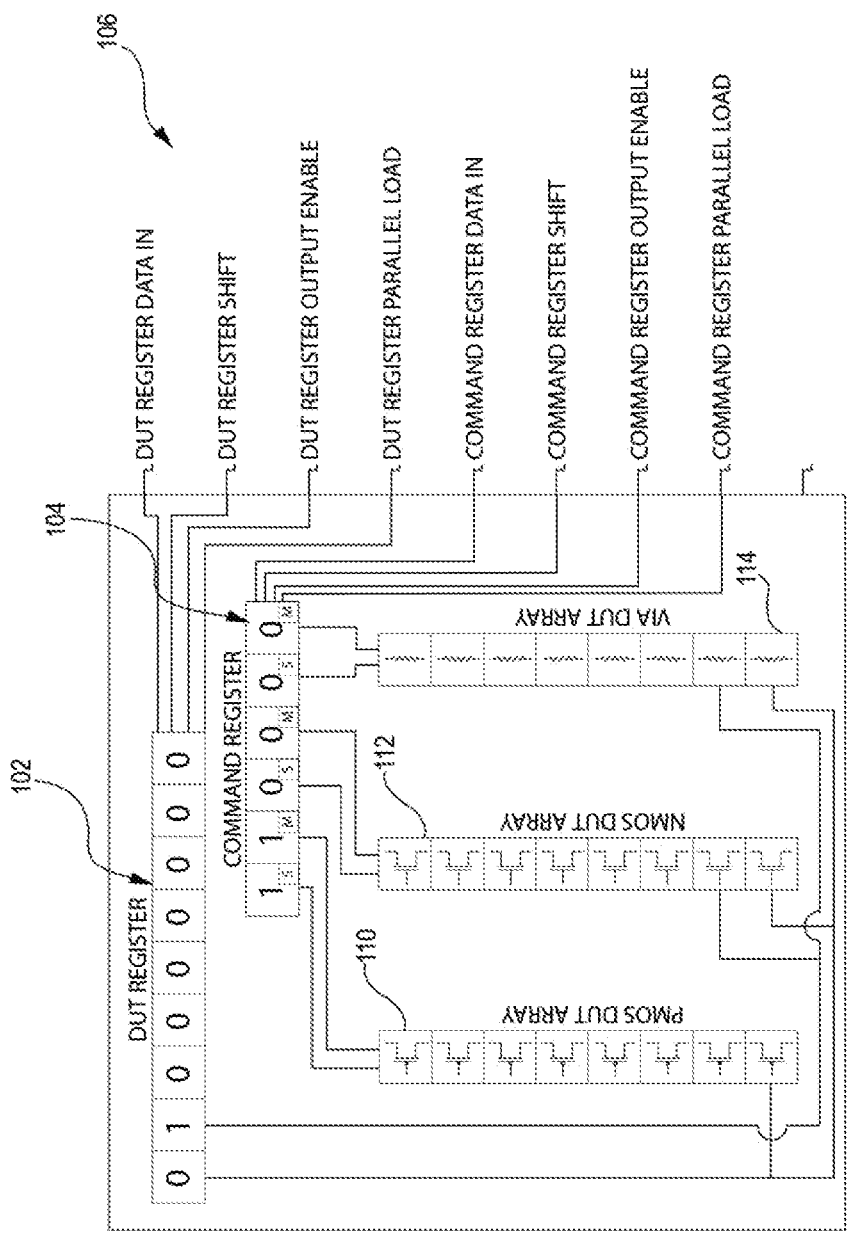
Figure 8:
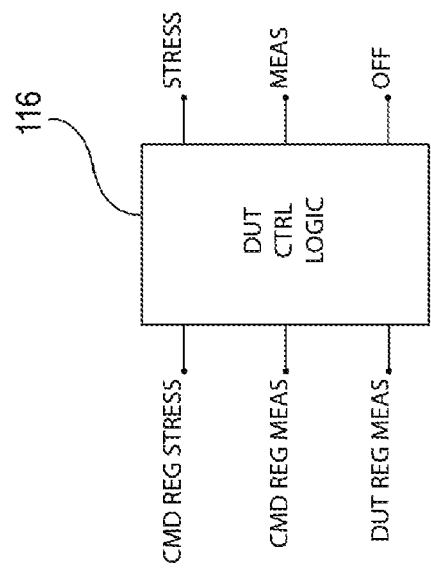
FIG. 8 is a diagram of an embodiment of a logic block within each DUT for decoding selection commands for the dual serial register.

An embodiment of a packaged test chip 100 and implementation of the addressing circuit with a DUT serial register 102 and a command register 104 is illustrated in FIGS. 7a-7b and 8. This dual-register approach is faster than the single register approach, particularly as the number of DUTs gets large, but is limited to applying stress to arrays of DUTs instead of individual DUTs and requires a logic block in each DUT. The analog stress pins 76, measurement pins 78 and power pins 80 are the same as the single register implementation. A common set 106 of digital pins (DUT REGISTER DATA IN, DUT REGISTER SHIFT, DUT REGISTER OUTPUT ENABLE, DUT REGISTER PARALLEL LOAD and COMMAND REGISTER DATA IN, COMMAND REGISTER SHIFT, COMMAND REGISTER OUTPUT ENABLE, COMMAND REGISTER PARALLEL LOAD) together pass the serial digital control bits from the benchtop tester onto the test chip for DUT serial register 102 and command register 104. As implemented, the number of pins can be reduced as one pin may serve multiple functions. For example, the shift and load functions may be controlled by a single pin where one logic state (for example "0") indicates a shift operation and the other logic state (for example "1") indicates a load operation. Heater VDD and VSS pins 108 are used to power up the local degradation accelerating heaters that are surrounding the DUTs. There are separate VDD and VSS pins for every DUT array.

In this example, packaged test chip 100 contains three DUT arrays; a PMOS DUT array 110 of PMOS transistors, a NMOS DUT array 112 of NMOS transistors and a VIA DUT array 114 of vias. Each individual DUT comprises a test device (e.g. PMOS transistor, NMOS transistor or via), one or more switch blocks each including a stress switch, a measurement switch and an off switch and a DUT control logic block 116 as shown in FIG. 8. DUT control logic block 116 decodes the DUT register measurement control bit and the command register stress and measurement control bits to control the stress, measurement and off switches. If the command register stress and either of the measurement control bits are zero, the off switch is closed to ground the terminal of the test device so that it does not float.

DUT register 102 is a serial register that is use to select individual DUTs for measurement. In this case the register has eight individual cells that store either one or zero. The values in these cells can be changed by shifting new data in serially from the DUT REGISTER DATA IN pin. The values stored (zero or one) in these individual cells control the logic of the DUTs. The first cell in the DUT register is connected to the first DUT in every DUT array, the second cell to the second DUT, etc.

Figure 12:
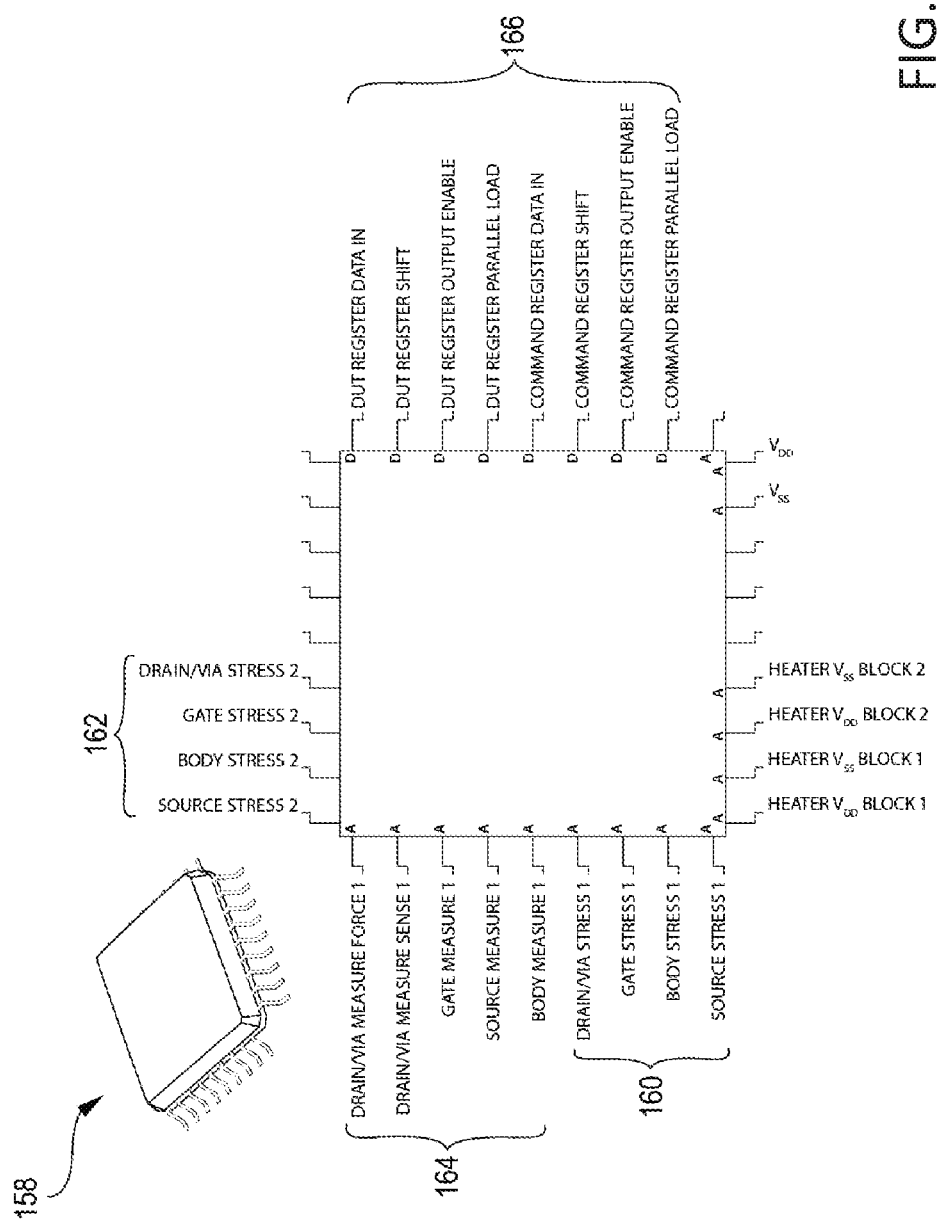
FIGS. 12-14 are diagrams of the pin out, serial register and switch block for an embodiment capable of applying different stress conditions to different groups of DUTs simultaneously.
Figure 13:
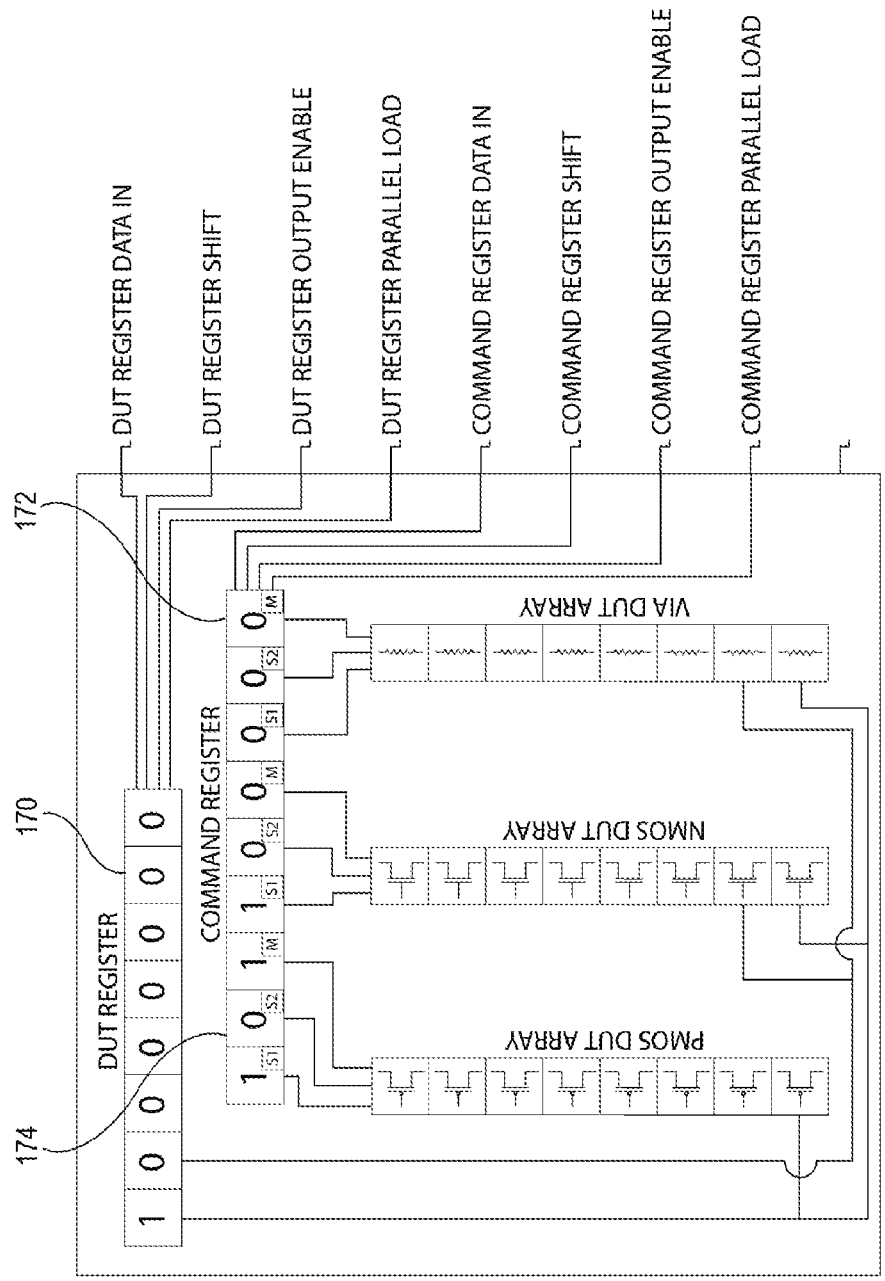
Figure 14:
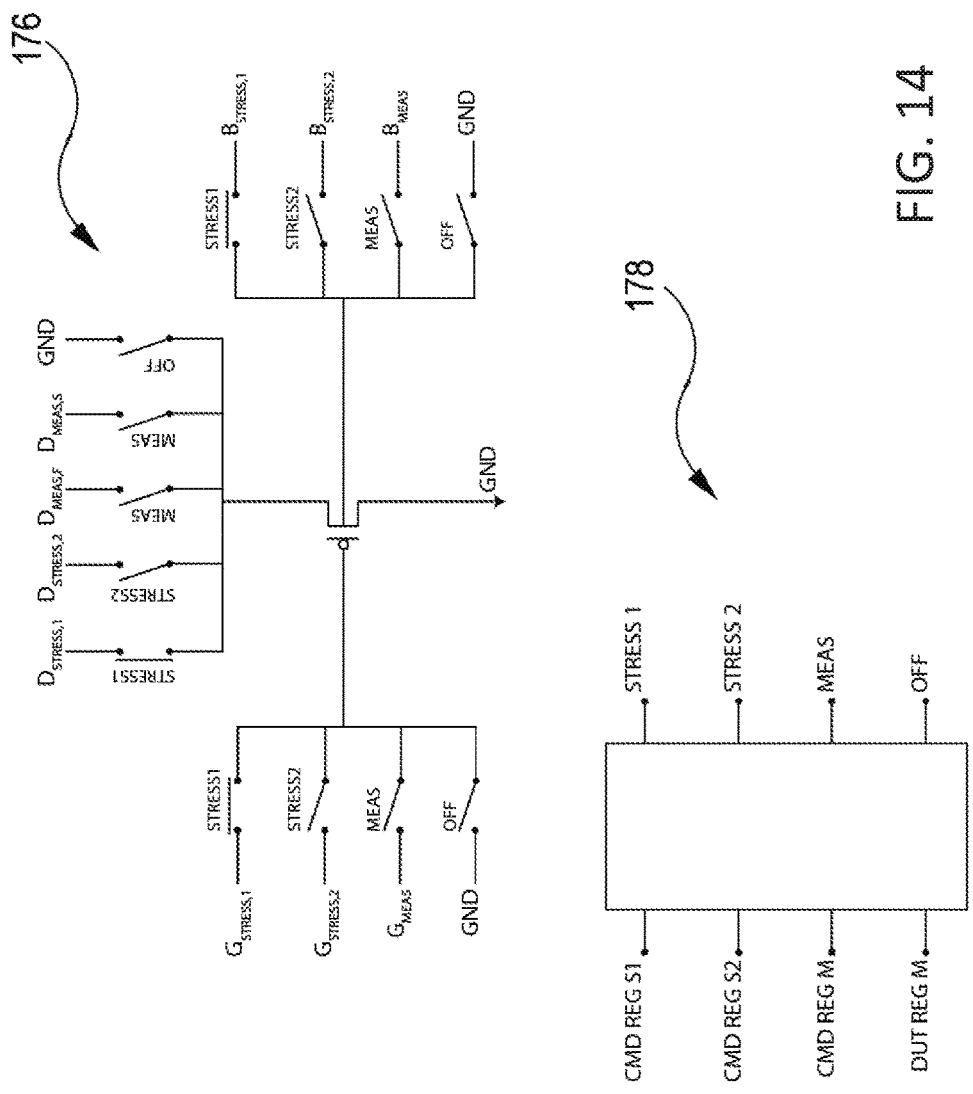

Command register 104 is another similar serial register and the stored values in it are used to select DUT arrays for stress and measurement. In this case the register has three individual cells, each cell including a "S" sub-cell and an "M" sub-cell that control the DUT array selection for stress and measurement. In the configuration shown, all three DUT arrays can be selected for stress simultaneously, the stress being the same for all arrays (a more complex topology in which different test condition can be given to different arrays is illustrated in FIGS. 12-14). The values in these cells can be changed by shifting new data in serially from the COMMAND REGISTER DATA IN pin. The values stored (zero or one) in these individual cells control the logic of the arrays. The first cell in the command register is connected to every DUT in the PMOS DUT array, the second cell in the command register is connected to every DUT in the NMOS DUT array and the third cell in the command register is connected to every DUT in the VIA DUT array. The register structure depicted in FIG. 6 can be used to implement both the DUT register and the command register. Alternately, each register may be implemented as a single register.

DUT control logic block 116 implements the following truth table:

| CMD S | CMD M | DUT M | STRESS | MEAS | Off |
|-------|-------|-------|--------|------|-----|
| 0 | 0 | 0 | 0 | 0 | 1 |
| 0 | 0 | 1 | 0 | 0 | 1 |
| 0 | 1 | 0 | 0 | 0 | 1 |
| 0 | 1 | 1 | 0 | 1 | 0 |
| 1 | 0 | 0 | 1 | 0 | 0 |
| 1 | 0 | 1 | 1 | 0 | 0 |
| 1 | 1 | 0 | 1 | 0 | 0 |
| 1 | 1 | 1 | 0 | 1 | 0 |

The logic block creates a MEAS signal if and only if CMD M and DUT M are high. If MEAS is high, STRESS cannot be high. OFF is high if both MEAS and STRESS are low. The test chip can pick one device from one array for measurement when other devices in the same array are still stressed and devices in other arrays are stressed. The test chip can also pick one device for measurement before and after stress. The OFF state ensures that no stresses are accidentally applied to the devices and that the terminals are not floating during their non-operational period.

Figures 9A, 9B:
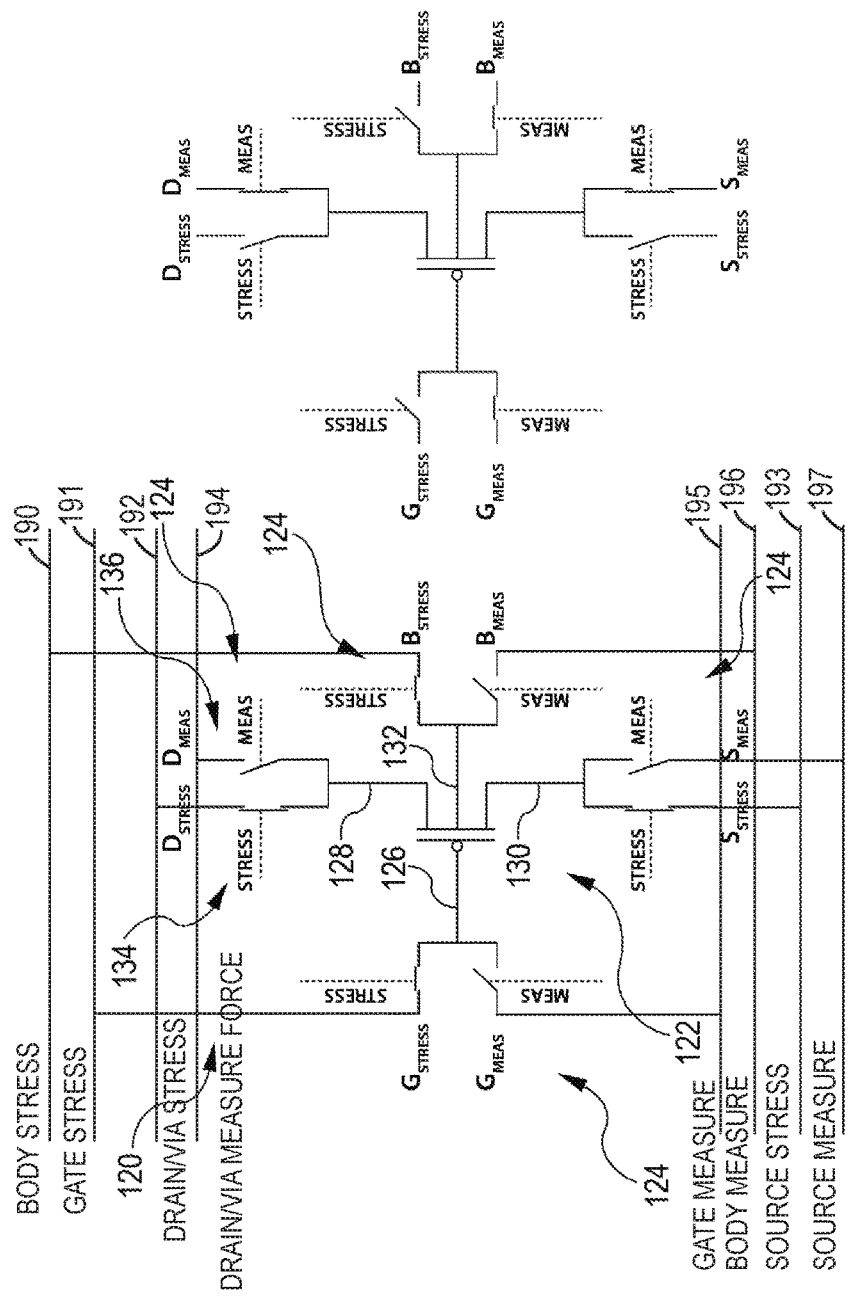
FIGS. 9a and 9b are diagrams of a DUT including a pMOS transistor with four switch blocks coupled to its G, D, S and body terminals under stress and measurement bias conditions, respectively.

FIGS. 9a and 9b shows a simplified topology of a PMOS DUT 120 in its stress and measurement configurations, respectively. DUT 120 includes a PMOS transistor 122 and a switch block 124 connected to each of its Gate, Drain, Source and Body terminals 126, 128, 130 and 132, respectively. Each switch block 124 includes a stress switch 134 and a measurement switch 136 that connect the terminal to stress or measurement pins on the package test chip. Analog buses 190, 191, 192, 193, 194, 195, 196 and 197 are formed on the die to connect each pin to a particular switch and device terminal on all of the DUTs. For example, an analog bus connects the top of the gate measurement switch for every DUT to the gate measurement pin. A different analog bus connects the top of the gate stress switch for every DUT to the gate stress pin.

In FIG. 9a, the STRESS switches 134 are closed and thus the DUT is in stress mode, i.e. receiving stress bias voltages or currents from the benchtop tester. In FIG. 9b, the MEAS switches 136 are closed, which means that now the DUT is in measurement mode and it is connected to measurement meter and measurement bias voltages/current sources on the benchtop tester. The control voltages for these switches are the held output voltages by the individual cell in serial register(s). The held output voltages are typically buffered, the buffer may be considered as part of the cell.

Additional CONFIG switches may be connected between terminals of the test device and selectively controlled to reconfigure the device itself. For example, a switch between the Gate and the Drain could be used to form a MOS diode.

Figures 10A, 10B:
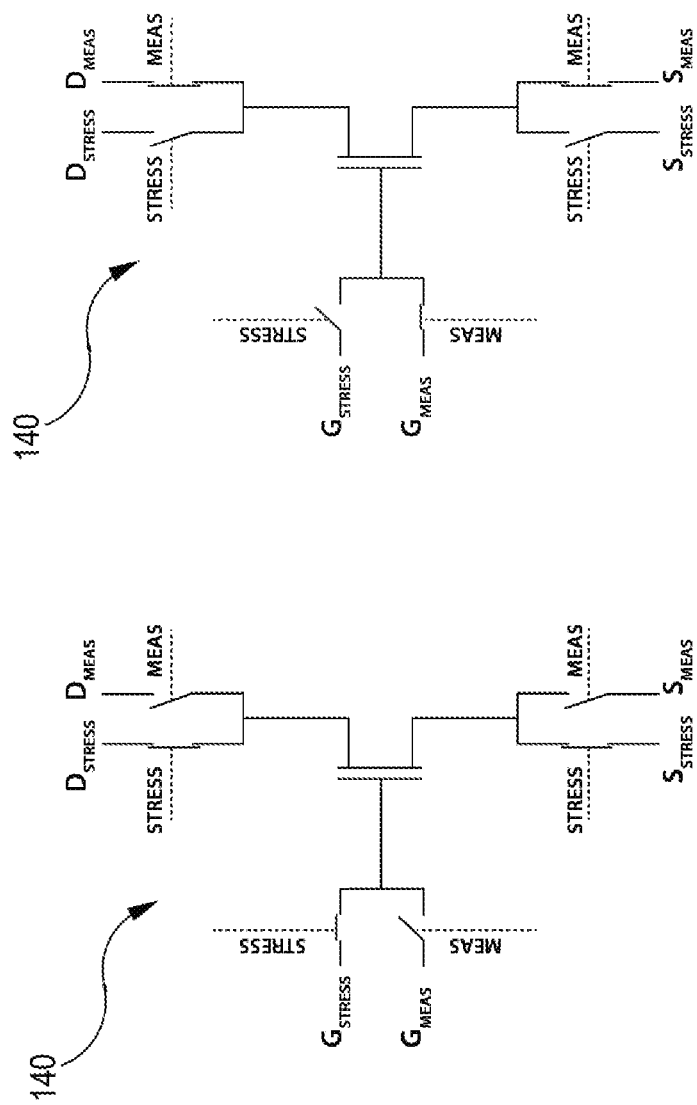
FIGS. 10a and 10b are diagrams of a DUT including a nMOS transistor with three switch blocks coupled to its G, D and S terminals under stress and measurement bias conditions, respectively.

FIGS. 10a and 10b show a simplified topology of an NMOS DUT 140. The topology is similar to the PMOS DUT except that an NMOS transistor does not have a body connection and thus a switch block is not provided to the body terminal.

Figure 11:
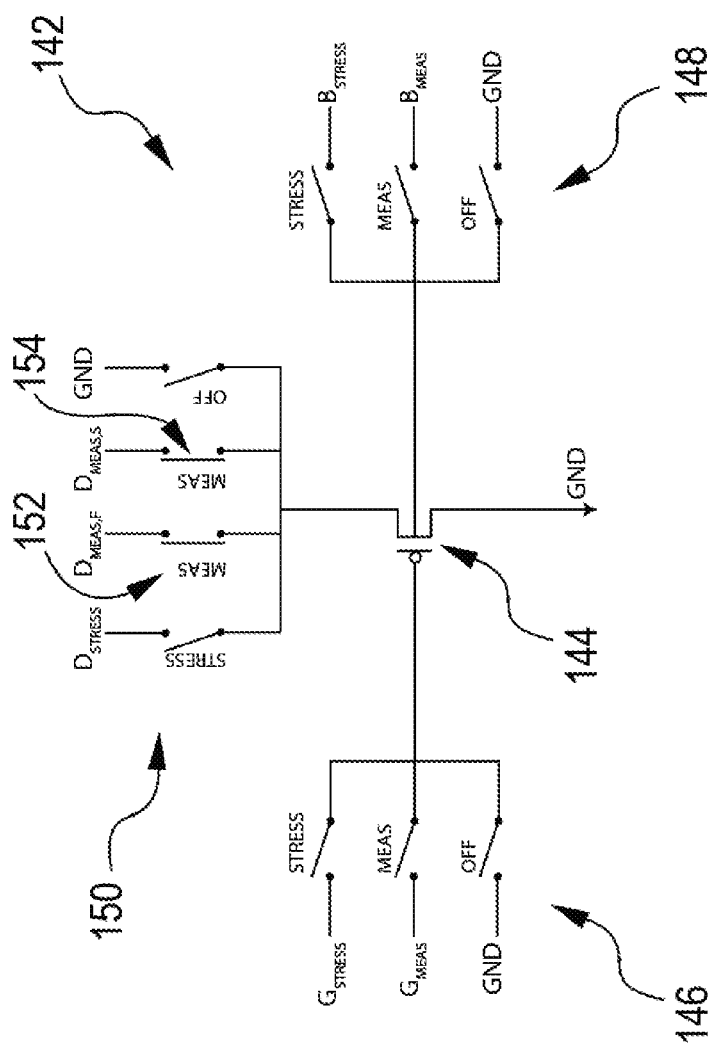
FIG. 11 is a diagram of an alternate embodiment of the switch block for an nMOS transistor including measurement force and measurement sense switches.

FIG. 11 illustrates another embodiment of a DUT 142 including a PMOS transistor 144. Each switch block 146, 148 and 150 includes the STRESS and MEAS switches. Each switch block also includes an OFF switch. The OFF control signal is set to be activated if neither MEAS nor STRESS signals are selected. During this state all the terminals of the DUT are pulled to ground so that no degradation mechanisms are activated. The drain switch block 150 includes a pair of measurement switches; measure-force switch 152 and measure-sense switch 154. The drain current used to bias the device during measurement can cause a voltage drop over the switch on the drain terminal. Thus, the actual DUT terminal voltage will be different than what is generated by the programmable voltage sources of the benchtop tester. It is important to measure this voltage drop so that the correct stress and measurement bias conditions will be recorded. This voltage drop can be measured through parallel measure-sense switch 154 that is connected to a voltmeter on the benchtop tester that has a low measurement current. This volt meter is connected to the test chip package pin $D_{MEAS,S}$ (drain measure, sense) and the measurement bias drain current flows through measure-force switch 152 and the terminal $D_{MEAS,F}$ (drain measure, force). Note that all the needed measurement and stress conditions can be created with grounded source terminal and that is why we have permanently connected this terminal to ground.

The total test time needed for comprehensive IC fabrication process reliability characterization can be considerably shortened by simultaneously applying several different degradation tests on several different DUT arrays on the test chip. The DUTs are still suitably measured one at a time (or in a parallel connection for some tests) for a sequence of different DUTs at the same measurement pin(s). Measurement time is typically a small fraction of the stress time and thus all measurements can be performed serially without affecting the total test time.

FIGS. 12-14 illustrate an embodiment of a packaged test chip 158 using a dual serial register to simultaneously subject different DUT arrays to two different stress conditions e.g. a hot carrier test and a PBTI test. The concept can be scaled up to three or more different stress conditions and may be implemented with a single serial register as well.

As shown in FIG. 12, there are now common sets of analog stress pins 160 and 162 but still one common set of analog measurement pins 164 and one common set of digital pins 166. The stress biasing resources on the benchtop tester are also doubled, i.e. the benchtop tester now has two stress utility plug-in daughter cards. Each daughter card is connected to only one set of analog pins on the test chip, i.e. the first set of stress and measurement utility plug-in cards are connected to the stress and measurement analog pins shown on the left side of the packaged chip and the second stress utility plug-in card is connected to the stress analog pins shown on the top side of the package. In a similar manner the capability to perform three or more simultaneous tests with different stress conditions can be built into the system, the amount of package pins and utility daughter cards on the benchtop tester will increase.

FIG. 13 shows the changes needed on the register level to accommodate different tests that are executed in parallel. DUT register 170 does not change. Command register 172 needs additional sub-cells for stressing. These added sub-cells 174 are labeled as 'S2'. Analogously, a third additional sub-cell (S3) per DUT array would need to be added to the command register in order to have a capability for three parallel test with different stress conditions. It is assumed that there is no need to measure two or more DUT arrays simultaneously, the measurement being a relatively fast operation.

FIG. 14 shows the changes needed on the DUT level to accommodate different tests that are executed in parallel. Each switch block 176 now includes two stress switches STRESS1 and STRESS2 on every terminal of every DUT to have the capability to perform two different tests simultaneously on one test chip. Analogously, three tests would require three stress switches. No additional measurement switches are needed since there is no major benefit in measuring DUTs from two arrays simultaneously. A DUT control logic block 178 needs one additional input and output signal per added stress condition.

The degradation mechanisms can be accelerated considerably with high temperatures during testing. The higher the temperature the faster the degradation will be and the shorter the time needed for testing. These types of tests are normally done by placing the test samples in an oven or placing test wafers on a hot chuck. The maximum temperature is limited by the temperature rating of the package that can be as low as 150° C. The usefulness of these techniques is further limited by the fact that the actual temperatures inside the chips are not known, especially when the DUTs are biased, which causes additional local temperature increase on top of the oven temperature. Local polysilicon resistor heaters have been used on wafer level reliability testing. In these wafer level tests the DUTs have been heated individually, one at a time.

Figure 15:
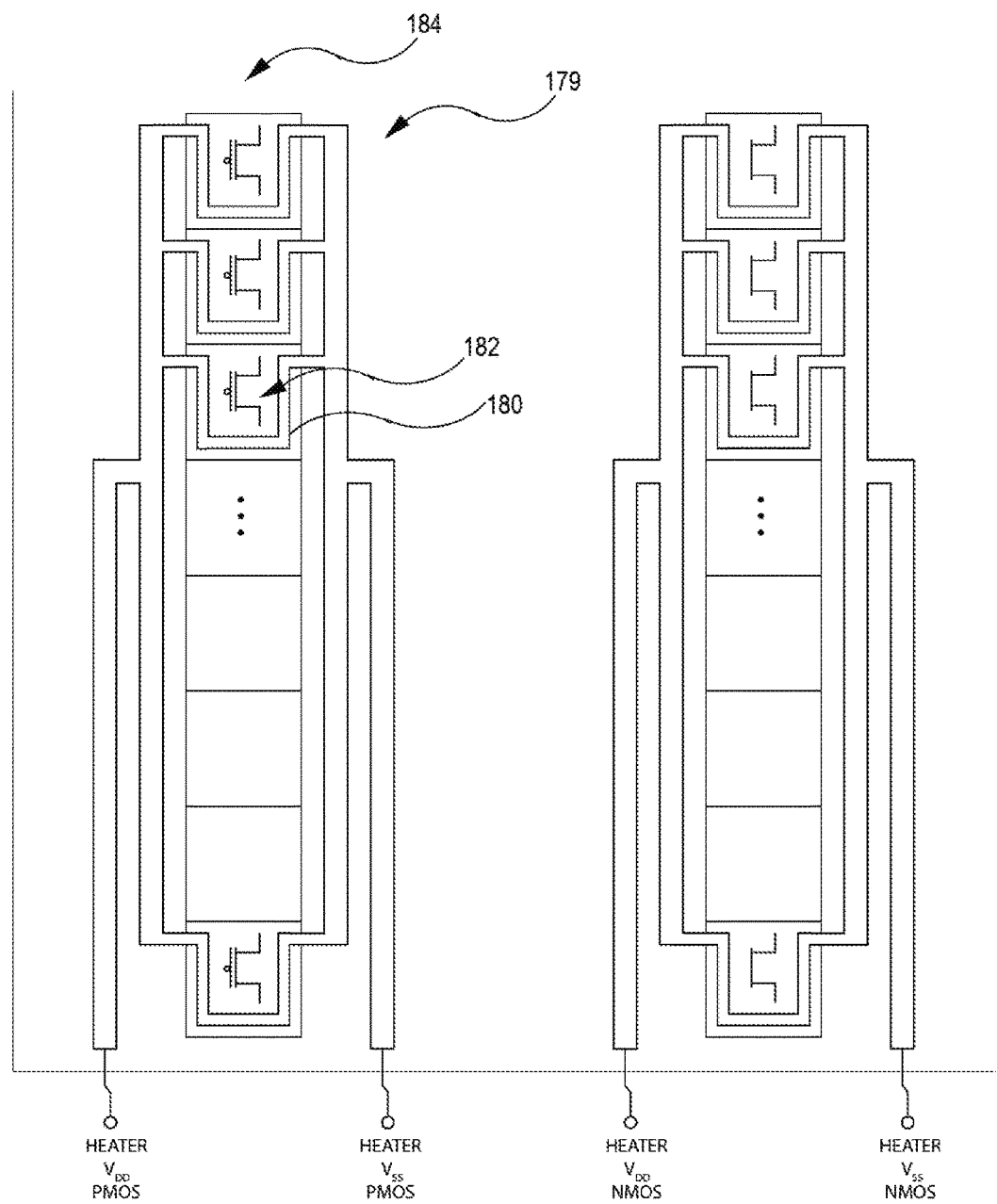
FIG. 15 is a diagram of die level heating elements around the IC test devices.

As shown in FIG. 15, arrays 179 of U-shaped local heaters 180 are wrapped around individual DUTs 182 in DUT arrays 184. The heaters are parallel connected similar to the corresponding DUT array, each heater array having its own heater VDD and VSS pins. The local heaters are resistive elements, such as poly resistors, polysilicon strips (e.g. formed from the gate polysilicon in a CMOS process) or diffusion resistors that are used to increase the temperature of the DUTs locally. The power to these heaters is delivered from the benchtop tester unit. Both DC current and pulse width modulated (PWM) heating can be used with the described heater to increase the temperature of the DUT to over 300 C.

The heaters cannot be addressed through switches because the overall resistance of the connections to and from a heater has to be kept low for maximum power transfer from electricity to heat in the vicinity of the DUT. The resistance of the actual resistive heaters wrapped around the DUT is kept at least hundred times higher than the combined resistance of the connections to the pins so that the heating power will be generated next to the DUT and not along the connections.

Temperature control is achieved by monitoring the temperature during the heating and feeding this information back to the benchtop tester, which sets the heating power in a way that the temperature stays constant at the desired value during the test period. Four examples of techniques used to monitor the temperature in this feedback control system are: 1) using temperature measurement diodes placed as close to the DUTs as possible, 2) using temperature measurement diodes that replace a DUT for this purpose, 3) measuring the temperature from the DUT itself, e.g. from the changes in the drain current of a FET or the resistance of a via or 4) measuring the temperature from the resistance changes in the heaters. All these measurements can be performed with the benchtop tester.

From a performance perspective the use of a single die containing both DUT structures and test infrastructure is the preferred solution as it facilitates running experiments on a large number of DUTs that (1) are guaranteed to have very similar characteristics, (2) are sufficient in quantity to provide statistical meaningful data, (3) can be simultaneously subjected to the same amount of stress both from an electrical as well as a timing perspective and (4) can be surrounded by local heating structures allowing a better control of the applied stress factors and hence providing an additional test execution acceleration factor. By further grouping DUTs of the same kind in blocks and only subjecting one block to a given test at a time and keeping the other blocks in a well-controlled power down situation, it allows to reuse the test chip for different experiments as well as to run different experiments on different blocks simultaneously. Having DUT structures and test infrastructure integrated on the same die also facilitates running measurements faster avoiding the occurrence of recovery effects that otherwise might kick-in due to less parasitics in the interconnect paths, making the test structures less sensitive to handling as well as minimizing the effects of leakage paths forthcoming from ESD protection diodes that otherwise might be needed.

As the main objective is to examine the reliability of the DUT structures a basic requirement for a test chip that holds both DUT structures and test infrastructure is that the test infrastructure can be guaranteed to be more robust than the DUT structures so that failure occurrences can be linked to the DUT structures. It also requires that the technology used to manufacture the test chip has a sufficient level of maturity so that its supports the design and implementation of the test infrastructure.

For new technologies and technologies that are still under development a full integration of both DUT structures and test infrastructure that fulfills the above listed requirements is very difficult to achieve as either the necessary design libraries to support the design of the test infrastructure are not yet available or are still immature or because no proper guarantees can be given on the reliability and robustness of the test infrastructure.

For such situations, an alternative solution is to build one or more DUT die ("test device die") using the process that is subject to characterization and qualification and that just hold the plurality of DUT structures (and optional local heating structures). The one or more DUT die may be a single die formed with multiple DUT structures, multiple DUT die each formed with a single DUT structure or multiple DUT die each formed with multiple DUT structures. The multiple die may be individually packaged or combined in a single package. The test infrastructure circuitry is built on separate TSIC or "test circuit die" using a more mature and possibly qualified IC process. With a "more mature" IC manufacturing process reference is made to an IC manufacturing process that already exist prior to the "new" to characterize IC manufacturing process for which a design library exists for which data exists that allows to assure that the design of the test infrastructure is more robust and more reliable than the DUT structures. With "qualified" reference is made to an IC manufacturing process for which performance and reliability data were gathered using the method and approach described or using other approaches and where the data then was validated using performance experiments and lifetime tests. With "new to characterize" reference is made to a newly not previously existing IC manufacturing process or an already existing IC manufacturing process that was subject to modifications and/or enhancements.

The test infrastructure circuitry may be built on a one or more test circuit die that are packaged with the DUT die (flip-chip mounted on the DUT or side-by-side), separately packaged, or configured from off-the-shelf (OTS) components that can be bought on the market and for which the operation and functionality is guaranteed by their manufacturers. This assures a more robust and reliable operation of the test infrastructure circuitry as well as supporting the implementation of the test infrastructure circuitry so that its performance is far less affected by aging than that of the actual DUT structures.

In one example, a 0.25 μm technology is seen as very mature, qualified IC fabrication process whereas a 22 nm technology is a new unqualified IC fabrication process. In another example, improvements on a mature qualified process such as changing line widths, changing the process flow—adding new steps, adding new capabilities etc. may turn a mature technology into a new one. For example, the addition of high voltage support to an existing low voltage 0.18 μm technology makes it a new IC process that must be qualified. In another example gathering data on devices with specific dimensions serving particular design goals and different from the devices on which data is available makes an existing and potentially already qualified process a new to qualify process.

Important aspects are the robustness and reliability of the test infrastructure circuitry in comparison to the DUT structures so that test results reflect the behavior of the DUT structures and are not dominated by the test infrastructure circuitry. As a basic rule knowledge on performance and reliability of the test infrastructure circuitry must excel that of the DUT structures that are subject to performance and reliability tests. Consider for example a qualified IC manufacturing technology of which other information is sought than what was gathered during previous qualification runs. To guarantee that the test results are not affected by the test infrastructure circuitry, the test infrastructure circuitry is to be built using an IC manufacturing process that is more mature and that has a guaranteed higher reliability. In an example consider a Time-Dependent-Dielectric-Breakdown (TDDB) test where the dielectric is stressed for long time under elevated or high voltage conditions and where the time-point of rupture is of interest. If in such case the test infrastructure circuitry is built from devices that have a similar dielectric as the DUT devices then it is not possible to tell whether the test result is due to a rupture in the DUT device or due to a rupture in the test infrastructure logic, hence in such case the test infrastructure logic has to be built using an IC manufacturing process that has a stronger dielectric and as such has a guaranteed higher reliability than that used to manufacture the DUT devices.

In another example a 65 nm process used to manufacture the test infrastructure circuitry can be seen as an unqualified process but more mature than a 22 nm process that is still under development that is used for developing the DUT structures.

One approach is to provide a test device die with only DUT structures and a test circuit die (TSIC) with the test circuitry. The test and measurement performance of such a solution will be impacted by the higher interconnect impedances between DUT structures and the test infrastructure circuitry, when compared to the situation when all functionality is integrated on a single die, but might profit from better parameters of the switching circuitry than when using a fully integrated solution. Such an approach also allows packing a large number of DUT structures on a minimal silicon surface.

For new and/or immature technologies that are still under development, another solution is to use a test device chip with DUT structures only that is put in a package and that is combined, using a printed circuit board or other interconnect means, with test infrastructure either integrated on another chip and sitting in another package or that is realized using off-the-shelf components. In such case the DUT die is just a collection of DUTs with their individual contact points. The drawbacks of this solution are higher interconnect parasitics (due to longer interconnects between DUT structures and test infrastructure) affecting measurement performance and limitations on the number of DUT structures that can be handled due to packaging and bonding limitations.

Despite these limitations, such an approach is still more beneficial than using a test device chip that only contains DUT structures and connecting these directly to test and measurement instrumentation. Using an approach based on a DUT die containing only DUT structures with their individual contact points and having those connected directly to test and measurement instrumentation, the number of test and measurement instruments needed is directly proportional to the number of DUT structures present. Consider for example a DUT die holding a single array of 12 DUT structures whereby each DUT structure has 4 contact points. In such case, 48 test and measurement instruments are needed to apply test conditions and collect measurement data. Furthermore long cables are needed to connect the test objects with the test and measurement instrumentation yielding high interconnect parasitics and affecting measurement performance and measurement quality limiting the measurement speed and timing resolution of the data collection.

As another example: consider a DUT die holding 100 DUTs to test, whereby each DUT has 4 contact points and a parallel test and measurement is used. This would require 400 test and measurement instruments to execute the test and collect the measurement data.

Considering the physical size and power requirements of high performing test and measurement equipment available on the market such an approach becomes very quickly impractical especially if the goal is to collect information that is statistically relevant requiring a sufficient number of test objects that have been created under the same manufacturing conditions and requiring the same test conditions to be applied to all the test objects being tested and measured.

Using our approach supporting a parallel test (stress application) and serial read out (measure) instead of requiring a multitude of test and measurement instrumentation the same information can be gathered using only 8 instruments. In the example case involving the test of 100 DUTs, instead of the need of 400 instruments only 4 instruments are needed allowing to test all 100 devices simultaneously and 4 instruments are needed to measure the individual DUTs one at a time. This approach comes at the cost of a time penalty due to the serial measurement approach but this penalty can be kept to a minimum using fast high performing test equipment. Such an approach allows reducing cost, limiting resources needed and maximizing usage of instrumentation.

An approach that combines DUT structures residing on one or more dies with test infrastructure circuitry that resides on another die in the same package or positioned close to the package that holds the DUT dies in combination with common stress and measurement busses that are connected to the individual DUT structures using appropriate switching circuitry overcomes most of the issues mentioned. This approach also assures that all test objects that are subject to a given test and measurement process receive the same test conditions and are subject to the same measurement conditions as well.

The test infrastructure circuitry that is on another die includes switches that allow the individual DUTs to be connected to the test and measurement instrumentation being part of the test system through analog busses conveying the test and measurement signals; of addressing circuitry comprising control registers and control logic that define the switch positions and as such define which DUTs are tested and which DUT is measured at a given moment in time; and of the analog busses for conveying the test and measurement signals.

In an example implementation, the DUT die(s) holding the DUT devices or test structures has(ve) comprise only the DUT devices and a matrix of contact points each linked to individual DUTs. There are no common contacts between DUTs on the DUT die. Combining the DUT die(s) with a TSIC that has a corresponding contact matrix forming a footprint that matches the contact matrix on the DUT die minimizes contact lengths and interconnect parasitics and overcomes some of the issues mentioned previously.

In the example implementation whereby the DUT die(s) holds DUT devices or test structures and a matrix of contact points each linked to individual DUTs, each DUT stands on its own and is intrinsically independent of the other DUTs present on the test structure. Each DUT could be operated, tested and measured on its own, however for practical reasons (limitation of test resources needed) they are grouped for testing/stressing (as to have a number of devices tested/stressed the same way) and measured/evaluated individually. By carefully controlling the voltage and/or current levels applied to the stress and measurement signals and the switching operations care can be taken that the measurement signals for "a" DUT are not affected by simultaneously testing other DUTs with same bias/operating conditions that might differ from the actual measurement/evaluation conditions applied to "a" given DUT when evaluating its behavior.

FIGS. 16-25 illustrate different embodiments for testing new or immature IC fabrication processes.

Figure 16:
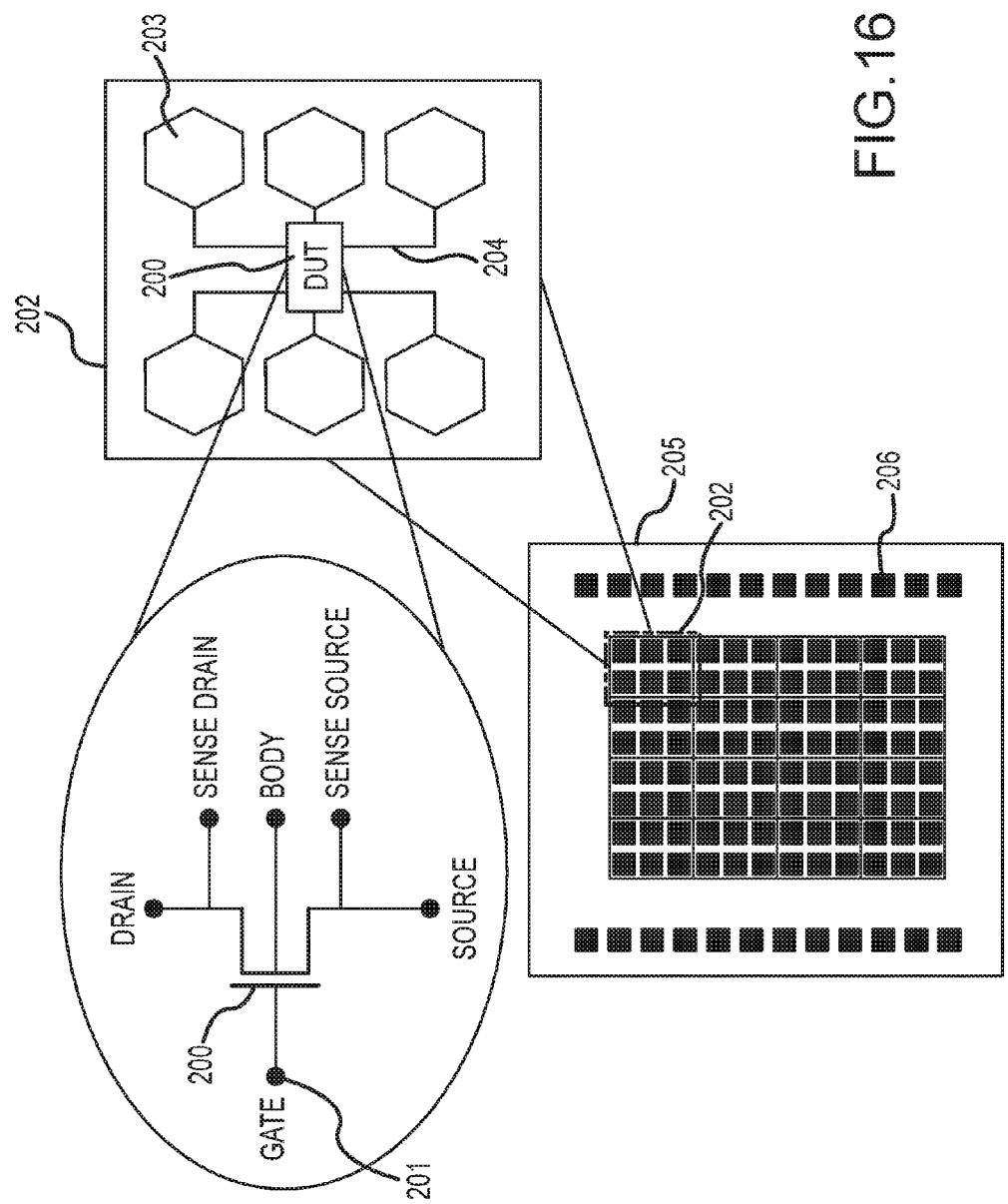
FIG. 16 is a diagram of a DUT die including DUT structures and control contact points fabricated with an IC process to be characterized and possibly qualified, including a zoom-in to DUT section and illustrating the case of a transistor being used as a DUT.

FIG. 16 depicts an embodiment of a DUT die 205 that has fabricated thereon one or more individual DUT structures 202. The DUT structures are organized in a matrix type of structure and are eventually accompanied with additional optional contact points 206 supporting the routing of control signals. The DUT structure 202 is comprised of a DUT 200 surrounded by contact points (probe pads) 203 and interconnects 204 between the DUT itself and the probe pads. The number of contact points of a given DUT varies in function of the number of actual DUT terminals. In the example a DUT structure is shown with 6 terminals representing a general transistor 200 with its base 4 terminals 201 (Gate, Drain, Body and Source) and 2 sense terminals (Sense_Drain and Sense_Source). The sense terminals that are physically to be connected as close as possible to the physical source and drain terminal of a transistor DUT structure allow to exactly determine the transistor's drain-source voltage difference in such a way that the measurement is not affected by voltage droops through the current carrying lines that connect to the source and drain terminals of the DUT.

As an example of combining a test device die containing one or more DUT structures manufactured in an immature technology and a test circuit die with test infrastructure circuitry designed and realized using a mature and well controlled technology, FIG. 17 shows a DUT die 208 with DUT structures 202 laid out in a matrix form and a TSIC 300 containing test infrastructure circuitry 207 (TSIC-TeSt Infrastructure IC) that has a footprint that matches the DUT area 209 of the DUT die 208, marked by the dotted area so that the two dies eventually can be glued together using flip-chip mounting/assembly techniques. On the DUT die 208 next to the contact points that connect to the DUT structures there are additional contact points 257 that allow to route control signals to the TSIC. Alternately, TSIC 300 may have a smaller footprint than the DUT die such that multiple TSICs are flip-chip mounted to the single DUT die. The DUT die 208 is fabricated with an IC fabrication process to be characterized and possibly qualified. The TSIC 300 is fabricated from a more mature and possibly qualified IC fabrication process. In an example application the DUT die is fabricated in a 45 nm low voltage process and the TSIC is manufactured in a 180 nm high voltage process.

Figure 19:
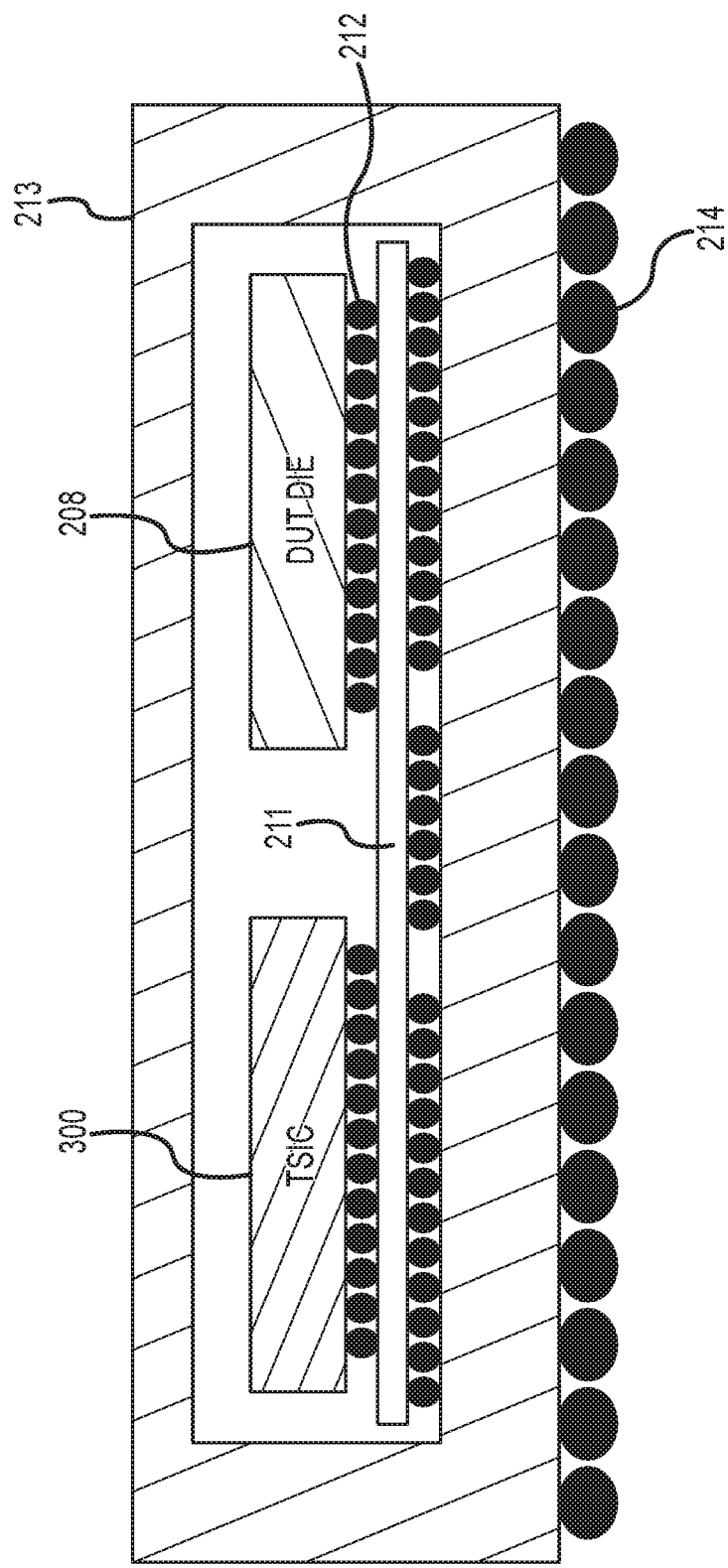
FIG. 19 is a diagram of the TSIC and DUT die mounted side-by-side on a carrier in a single package.

FIG. 18*a* illustrates an embodiment in which both DUT die 208 and TSIC 300 are assembled in one package 210. FIG. 18*b* illustrates an embodiment in which the DUT die 208 is directly attached to a carrier 301 (such as a PCB) and the TSIC 300 is attached to DUT die 208 without the use of a package. In an example application the DUT die is fabricated in a 22 nm process and the TSIC is manufactured in a 250 nm well know process. The DUT die 208 may also comprise local heating structures (not shown) next to the DUT structures 202 and related temperature sensing elements. The DUT die is glued to the package body to assure good thermal contact and heat removal. The TSIC 300 is flip-chip mounted on top of the DUT die 208 to connect bumps 259. The external control signals are routed from the TSIC over the DUT die and then wire-bonded via wire bonds to the package pins or to the carrier FIG. 19 illustrates another embodiment in which both DUT die 208 and TSIC 300 are assembled in one package 213. TSIC and DUT die are mounted side-by-side and flip-chip connected to a carrier board 211 inside the package using solder bumps 212. Depending on the complexity of the DUT die 208 other mounting techniques may be used as well. The carrier board on its turn makes connection to the package pins. The example shows a situation where the package is of the ball-grid array type. Alternately, TSIC 300 may have a smaller footprint than the DUT die 208 such that multiple TSICs are mounted side-by-side to the single DUT die.

Figure 20:
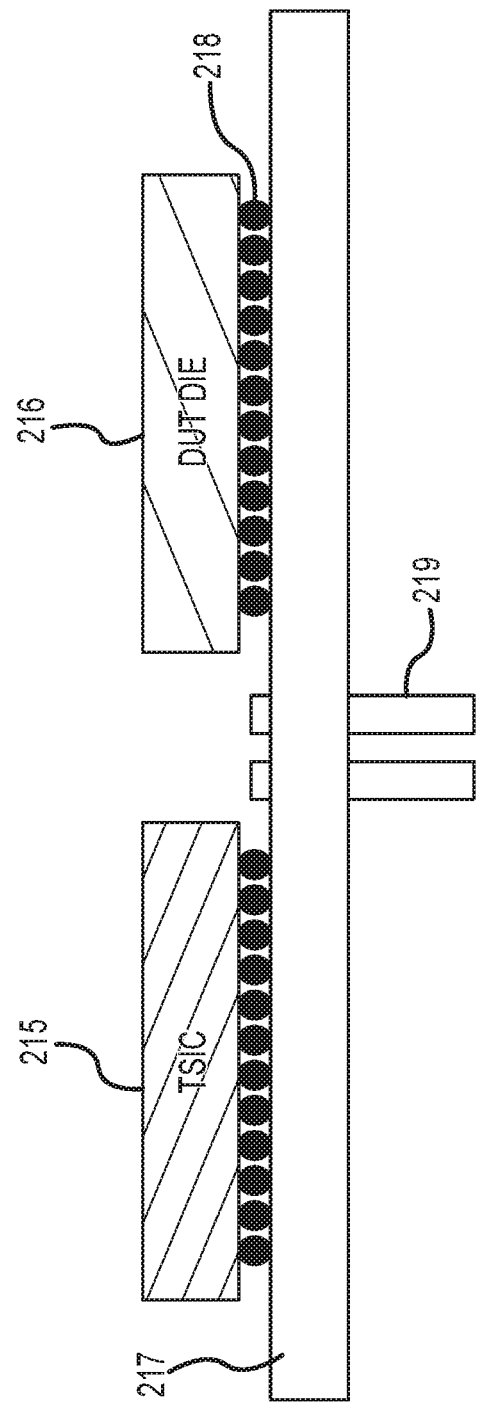
FIG. 20 is a diagram of the TSIC and DUT die, each residing in a separate package (or as dies), mounted on an adapter board.
Figure 21:
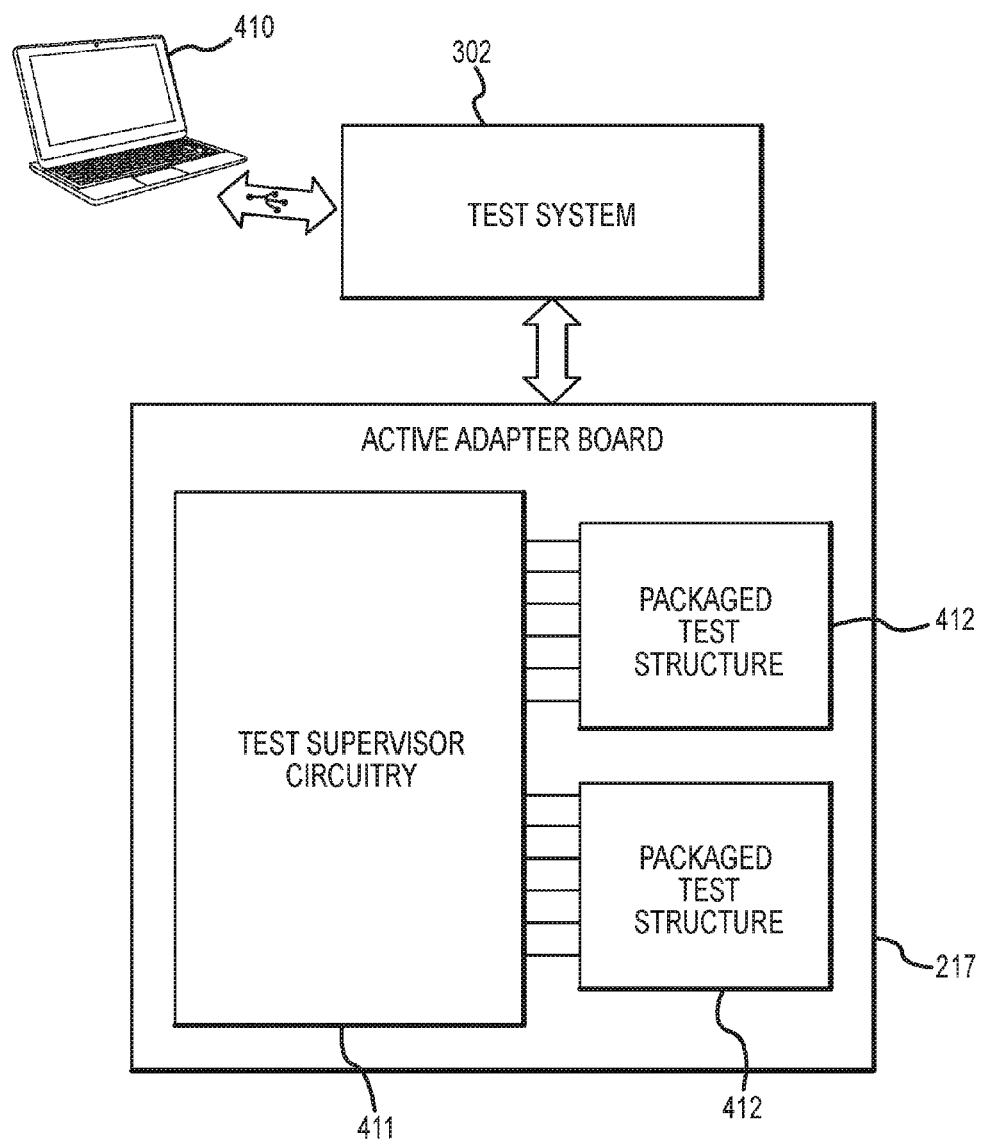
FIG. 21 is a diagram of an embodiment of a test system.

FIG. 20 illustrates an embodiment in which a DUT die 216 and a TSIC 215 are individually packaged and then soldered on using solder balls 218 on an adapter board 217 that has pins 219 to directly interface to a test system 302 shown in FIG. 21. In the example TSIC and DUT die reside in Ball-Grid Array (BGA) type packages but could equally reside in other package types. FIG. 20 equally illustrates an embodiment in which a DUT die 216 and a TSIC 215 are not packaged but directly mounted using flip-chip mounting techniques using solder bumps 218 on an adapter board 217 that has pins 219 forming a connecting interface that mates the interface of the test system 302 and allows the adapter board to directly interface to the test system 302 shown in FIG. 21. As illustrated in FIG. 21 the number of DUT dies is not restricted to one.

FIG. 21 illustrates an embodiment in which multiple packaged test structures 412, each holding one or more DUT dies and each die holding one or more test structures are mounted on active adapter board 217 that serves as a test interface card, that also holds the test supervisor circuitry 411, either being realized as an IC or built from off-the-shelf (OTS) components or a mixture thereof, that on its turn connects to a test system 302 that provides the test and measurement instrumentation and test and measurement signals to the DUTs and that on its turn is controlled using a PC 410. OTS components are components that are readily available, that can be purchased as standard logic circuits or programmable circuits such as CPLDs (custom programmable logic devices) FPGAs (field programmable gate arrays), base building blocks that are available as integrated circuits of which their functionality and performance is guaranteed by their manufacturers, . . . .

Figure 22:
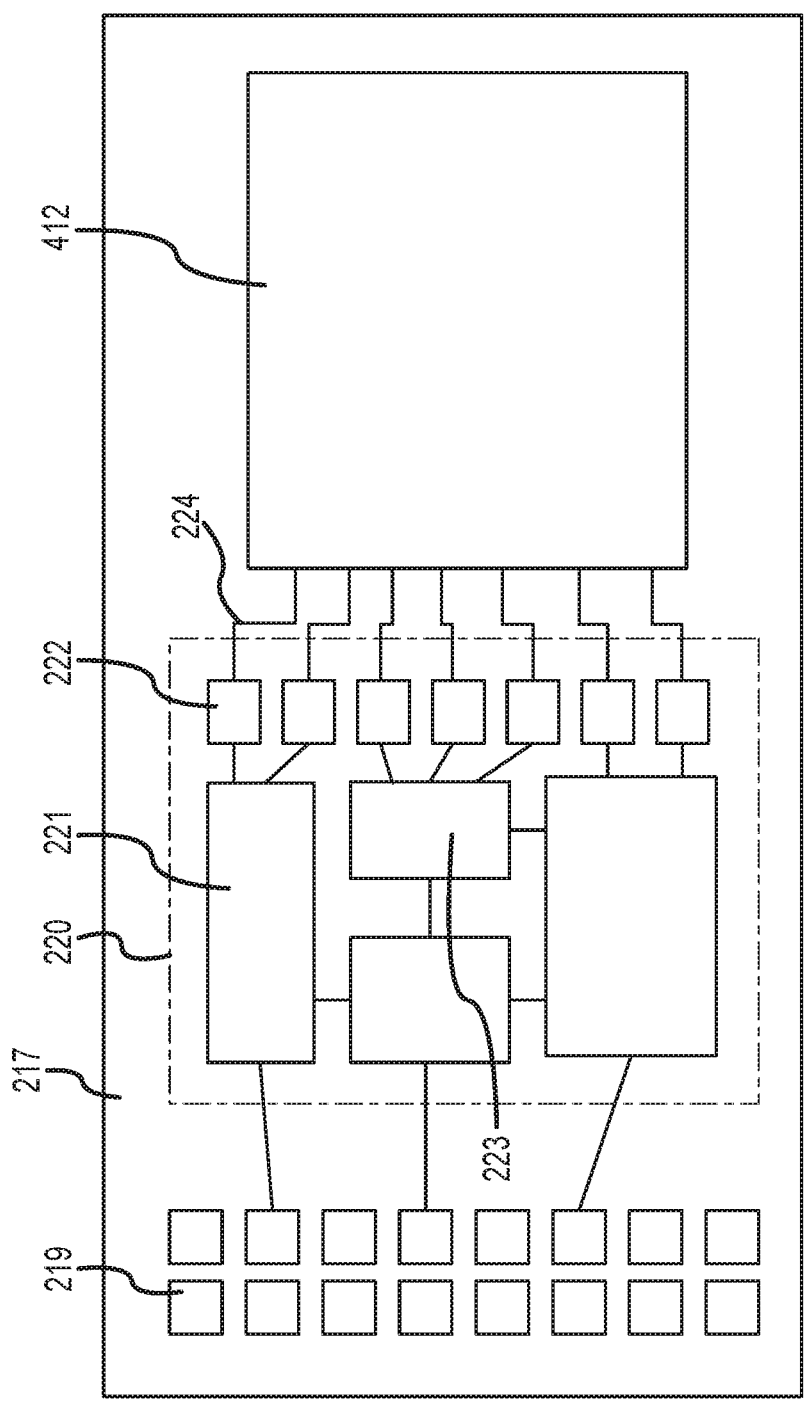
FIG. 22 is a diagram of an adapter board with mating interface to the test platform holding a DUT die in which the test infrastructure circuitry is realized using off-the-shelf components residing in different packages.

FIG. 22 illustrates an embodiment of an adapter board 217 that holds a package 412 containing one or more DUT dies each holding one or more test structures, that has pins 219 forming a connecting interface that mates the interface of the test system 302 and allows the adapter board to directly interface to the test system, that has routing 224 and that holds off-the-shelf components 221, 222, 223 realizing the test infrastructure circuitry and are residing in the dotted area 220. Typical building blocks to realize the TSIC functionality comprise digital components 221, analog components 223 and switches 222.

Figure 23:
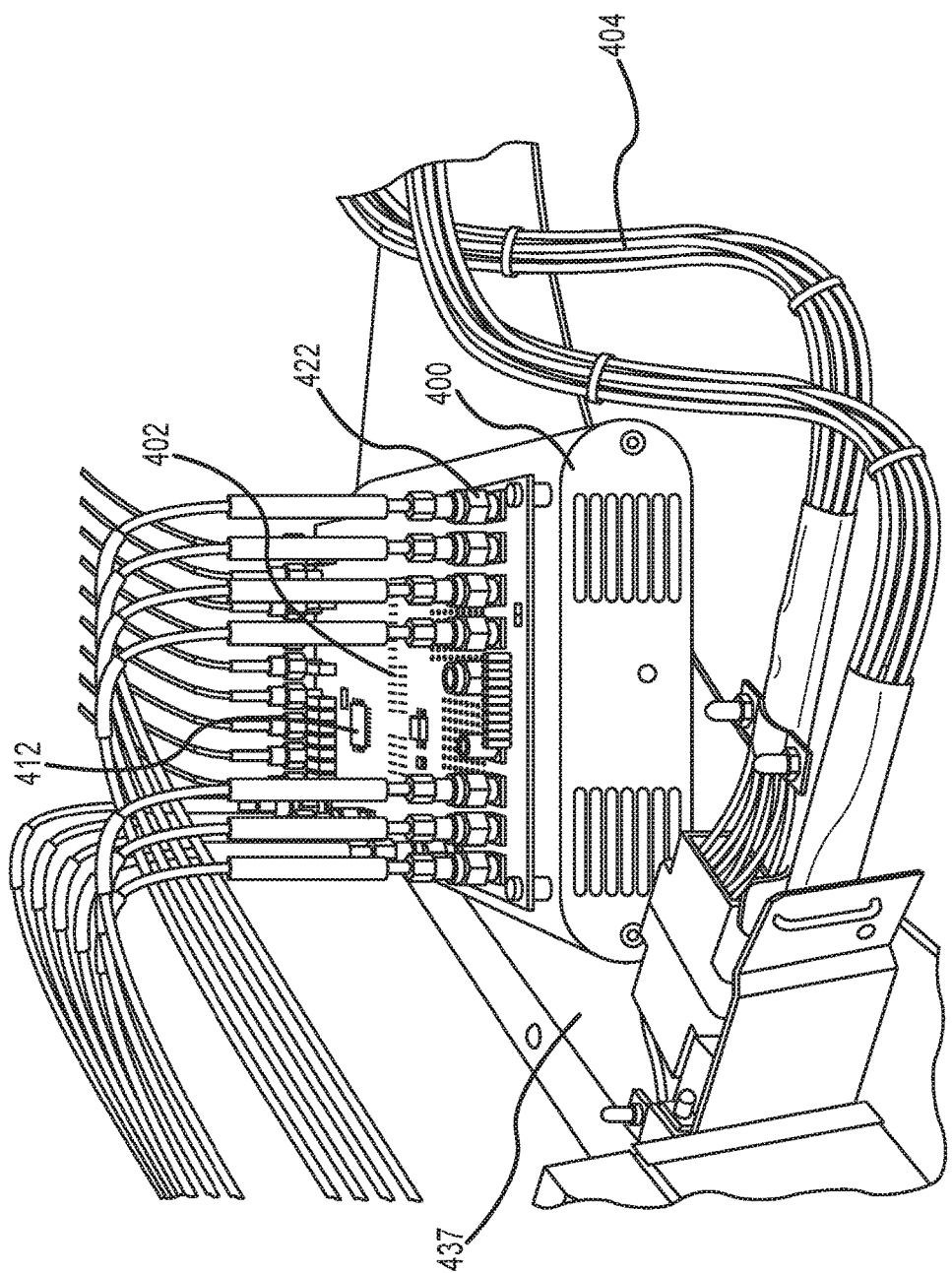
FIG. 23 is a diagram of an embodiment of a system deployed for wafer level testing.

FIG. 23 depicts an embodiment of a system 400 with an adaptor board 402 that contains TSIC control logic realized using discrete building blocks 412 and connectors 422 that allow connection to a set of cables 404 that link to a probe card (not shown) that on its turn connects to a DUT structure that resides on a wafer. This concept is further illustrated in FIG. 24.

Figure 24:
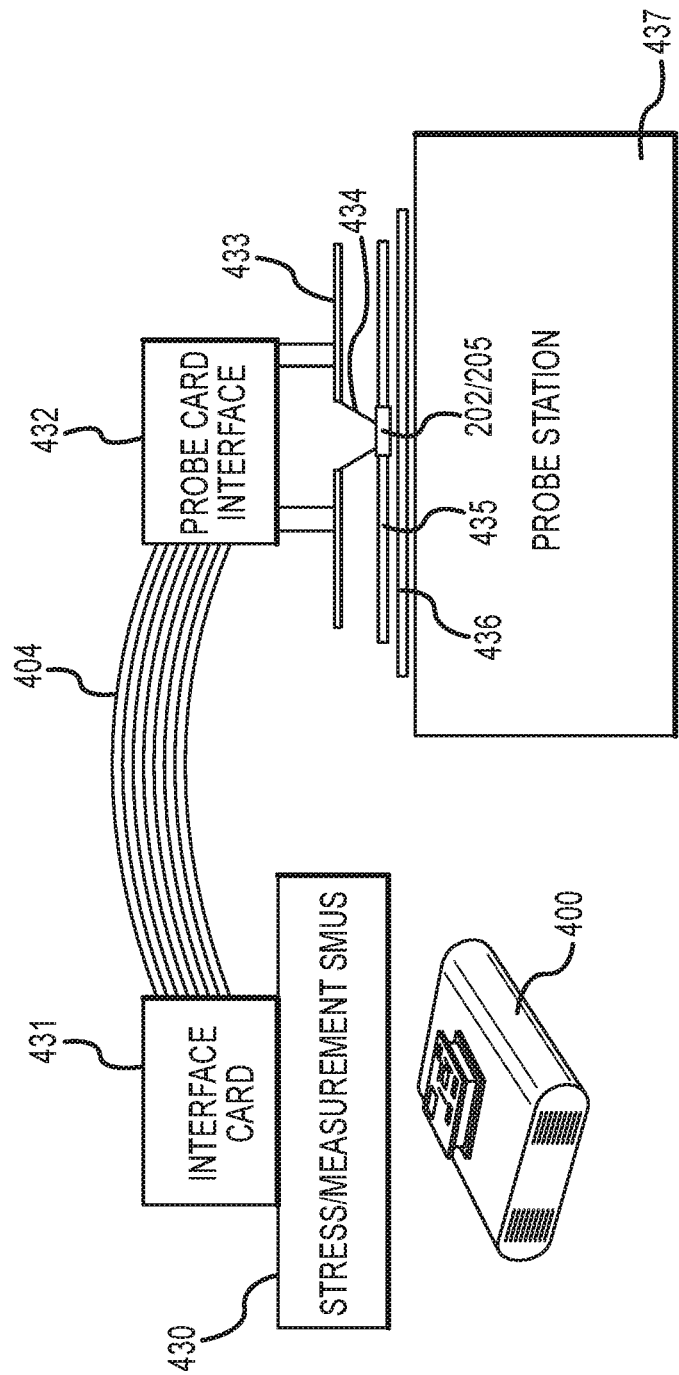
FIG. 24 is a diagram of an embodiment of a system for testing a wafer with a DUT die holding DUT test structures that are connected through a probe card with probe card interface that connects to a test system holding an interface card.

FIG. 24 shows an embodiment consisting of a test system 400 containing stress and measurement units/instrumentation (SMUs) 430, that connects to an interface card 431 that also may hold test infrastructure circuitry, that on its turn connects using a set of cables 404 to a probe card interface 432 of a probe card 433 that connects using probe pins or probe needles 434 to a DUT structure 202 or DUT die 205 that is still part of a wafer 435 that is hold by a wafer chuck 436 that is positioned and controlled by the probe station 437.

Wafers are pushed through the manufacturing process holding multiple copies of the same circuit next to each other. The space in between those circuits is what is called the scribe lines. At the end of the process and prior to packaging the wafer is cut in pieces, using the scribe lines as cutting space. The individual pieces after cutting are then called die. Scribe line structures are normally used to monitor the different stages in the IC manufacturing process as to make sure that the process runs well and are typically destroyed when the dies on the wafer are cut apart.

From a test perspective, and for a general IC, a first test is typically conducted when the die are still part of the wafer prior to dicing to avoid that die with manufacturing problems are getting packed. This test is typically denominated as wafer probing or probe test. After probe test the wafer is diced and only the good dies are packed. Next they are subjected to another test, typically denominated as final test before they are released to customers.

Figure 25:
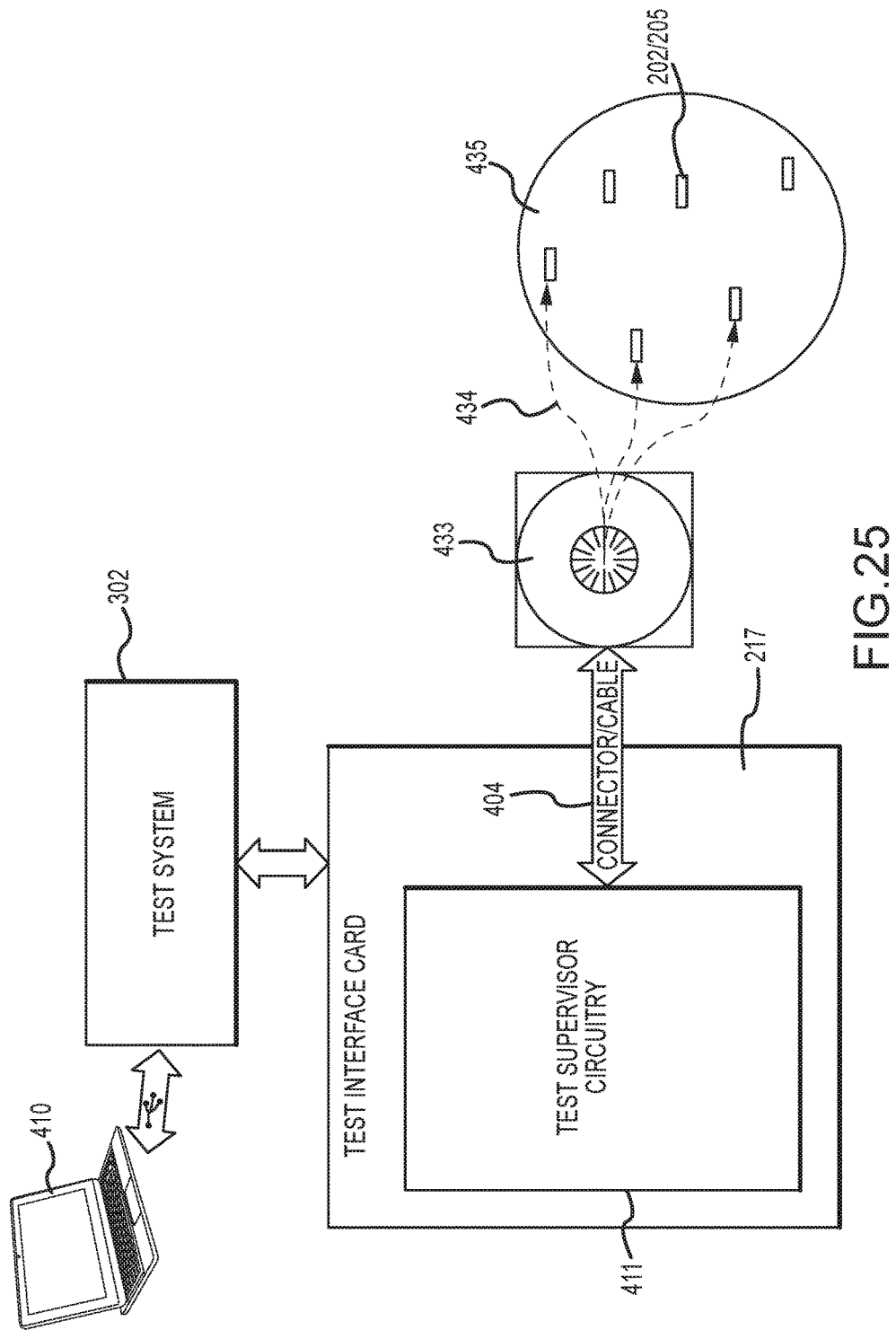
FIG. 25 is a diagram of an embodiment of a system for testing a wafer with multiple DUT die and test structures that are connected through a probe card that connects to an interface board that holds the test infrastructure circuitry that connects to the system.

FIG. 25 shows an embodiment consisting of a test system 302 containing stress and measurement resources, that is under control of a host controller/PC 410, that connects to an interface card 217 serving as an interface to the wafer probe card that holds test supervisor circuitry 411 either being realized as an IC or built from OTS components or a mixture thereof, that on its turn connects using a set of cables 404 to a probe card 433 that connects using probe pins or probe needles 434 to one or more DUT structures 202 or DUT dies 205 that are still part of a wafer 435.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A programmable test structure for characterization of a first integrated circuit (IC) fabrication process, said test structure comprising:
   one or more test device die each fabricated with said first IC fabrication process, said one or more test device die comprising a plurality of devices under test (DUT), each said DUT comprising a test device having one or more terminals;
   a plurality of contacts including a first common set of addressing contacts configured to receive measurement selection commands and a second common set of measurement contacts coupled to each DUT;
   one or more test circuit die fabricated with one or more IC fabrication processes different than said first IC fabrication process, said one or more test circuit die comprising one or more switch blocks for each said DUT, each said switch block including a measurement switch coupled between one of the terminals and one of the measurement contacts, and
   one or more test circuit die fabricated with one or more IC fabrication processes different than said first IC fabrication process, said one or more test circuit die comprising an addressing circuit that couples the first common set of addressing contacts to each of the DUT switch blocks, said switch blocks responsive to said measurement selection command to simultaneously test a plurality of DUTs and read out serially one or more measurement signals for the tested DUTs at the second common set of one or more of the measurement contacts that characterize the first IC fabrication process.

2. The programmable test structure of claim 1, wherein said DUTs are independent of each other, each said measurement signal is indicative of the testing of that one said DUT independent of the other simultaneously tested DUTs.

3. The programmable test structure of claim 1, wherein said one or more switch blocks and said addressing circuit are integrated on a single test circuit die.

4. The programmable test structure of claim 1, wherein said one or more test device die and said one or more test circuit die are in a single package.

5. The programmable test structure of claim 4, wherein one or more said test circuit die are mounted side-by-side with said test device die.

6. The programmable test structure of claim 5, wherein said one or more test device die and one or more test circuit die are in first and second packages, respectively, and mounted on a common carrier.

7. The programmable test structure of claim 4, wherein one or more of said test circuit die are flip-chip mounted on the surface of one of the test device die.

8. The programmable test structure of claim 1, wherein said test circuit die that include the said one or more switch blocks and said addressing circuit are configured from one or more off-the-shelf components.

9. The programmable test structure of claim 1, wherein a plurality of said test device die are on a wafer.

10. The programmable test structure of claim 1, wherein said measurement selection commands comprise digital measurement selection commands, wherein said addressing circuit comprises a single serial register that is coupled to one of the addressing contacts to receive and store digital measurement selection commands for the plurality of DUTs in respective cells of the serial register for each serial entry in a sequence of selection commands, each said cell connected to a different DUT to control the one or more switch blocks.

11. The programmable test structure of claim 1, wherein said measurement selection commands comprise digital measurement selection commands, wherein said plurality of DUTs are grouped into a plurality of equal length linear DUT arrays, said addressing circuit comprises a DUT serial register coupled to one of the addressing contacts to receive and store digital measurement selection commands for individual DUTs in the linear array in respective cells of the DUT serial register that are each connected to the same DUT in every linear array, and a command serial register coupled to another one of the addressing contacts to receive and store digital measurement selection commands for DUT arrays in respective cells of the command serial register that are each connected to all of the DUTs in the respective DUT arrays, each said DUT further comprising a logic block responsive to the measurement selection commands for individual DUTs and DUT arrays to control the one or more switch blocks.

12. The programmable test structure of claim 1, wherein said one or more test device die further comprise a plurality of resistive heating elements fabricated on the test device die and wrapped around the DUTs, each resistive element coupled to and through a pair of contacts on the die to a pair of external heat contacts.

13. The programmable test structure of claim 1, where said first IC fabrication process is an unqualified IC fabrication process and wherein said different IC fabrication processes are qualified IC fabrication processes.

14. The programmable test structure of claim 1, wherein said different IC fabrication processes are more mature processes than said first IC fabrication process.

15. The programmable test structure of claim 1, wherein each said test device is an analog test device, wherein said switch blocks responsive to said measurement selection command pass analog signals to simultaneously test the plurality of DUTs and read out serially one or more analog measurement signals.

16. The programmable test structure of claim 15, wherein each said DUT comprises a single said analog test device selected from one of a transistor, a diode, a contact or a via.

17. The programmable test structure of claim 1, wherein the one or more test device die comprise only the plurality of DUTs and the second common set of measurement contacts coupled to each said DUT.

18. The programmable test structure of claim 1, wherein the plurality of DUTs have no common measurement contacts.

19. A programmable test structure, for characterization of a first integrated circuit (IC) fabrication process, said test structure comprising:
   one or more test device die each fabricated with said first IC fabrication process, said one or more test device die comprising a plurality of devices under test (DUT), each said DUT comprising a test device having one or more terminals;
   a plurality of contacts including a first common set of addressing contacts configured to receive measurement selection commands and a second common set of measurement contacts coupled to each DUT;

one or more switch blocks for each said DUT, each said switch block including a measurement switch coupled between one of the terminals and one of the measurement contacts, and an addressing circuit that couples the first common set of addressing contacts to each of the DUT switch blocks, said switch blocks responsive to said measurement selection command to simultaneously test a plurality of DUTs and read out serially one or more measurement signals for the tested DUTs at the second common set of one or more of the measurement contacts that characterize the first IC fabrication process, wherein said switch blocks and addressing circuit are fabricated from different IC fabrication processes than said first IC fabrication process, further comprising a third common set of stress contacts, each said switch block including a stress switch coupled between the terminal and one of the stress contacts, said addressing circuit responsive to the measurement selection commands to close the stress switches for a first group of DUTs to couple the addressing contacts in the third common set to the DUT terminal to first bias conditions to simultaneously stress the DUTs in the first group, said addressing circuit responsive to the measurement selection commands to open the stress switches and close the measurement switches for the first group of DUTs one DUT at a time to read out serially the one or more measurement signals.

20. The programmable test structure of claim 19, further comprising a fourth common set of stress contacts, each said switch block including a second stress switch coupled between the terminal and one of the stress contacts, said addressing circuit responsive to the measurement selection commands to close the stress switches for a second group of DUTs to couple the addressing contacts in the fourth common set to the DUT terminal to apply second bias conditions to simultaneously stress the DUTs in the second group while the first bias conditions are applied to stress the first group, said addressing circuit responsive to the measurement selection commands to open the stress switches and close the measurement switches for the second group of DUTs one DUT at a time to read out serially the one or more measurement signals.

21. A programmable test structure for characterization of a first integrated circuit (IC) fabrication process, said test structure comprising:
one or more test device die each fabricated with said first IC fabrication process, said one or more test device die comprising a plurality of devices under test (DUT), each said DUT comprising a test device having one or more terminals;
a plurality of contacts including a first common set of addressing contacts configured to receive measurement selection commands and a second common set of measurement contacts coupled to each DUT;
one or more switch blocks for each said DUT, each said switch block including a measurement switch coupled between one of the terminals and one of the measurement contacts, and
an addressing circuit that couples the first common set of addressing contacts to each of the DUT switch blocks, said switch blocks responsive to said measurement selection command to simultaneously test a plurality of DUTs and read out serially one or more measurement signals for the tested DUTS at the second common set of one or more of the measurement contacts that characterize the first IC fabrication process,
wherein said switch blocks and addressing circuit are fabricated from different IC fabrication processes than said first IC fabrication process.

22. A programmable test structure for characterization of a first integrated circuit (IC) fabrication process, said test structure comprising:
one or more test device die each fabricated with said first IC fabrication process, said one or more test device die comprising a plurality of devices under test (DUT), each said DUT comprising a test device having one or more terminals;
a plurality of contacts including a first common set of addressing contacts configured to receive measurement selection commands and a second common set of measurement contacts coupled to each DUT;
a test circuit die fabricated with a second IC fabrication process different than said first IC fabrication process, said test circuit die comprising one or more switch blocks for each said DUT, each said switch block including a measurement switch coupled between one of the terminals and one of the measurement contacts, and an addressing circuit that couples the first common set of addressing contacts to each of the DUT switch blocks, said switch blocks responsive to said measurement selection commands to simultaneously test a plurality of DUTs and read out serially one or more measurement signals for the tested DUTs at the second common set of one or more of the measurement contacts to that characterize the first IC fabrication process.

23. A programmable test structure for characterization of an unqualified integrated circuit (IC) fabrication process, said test structure comprising:
one or more test device die each fabricated with said IC fabrication process, said one or more test device die comprising a plurality of independent devices under test (DUT), each said DUT comprising a test device having one or more terminals;
a plurality of contacts including a first common set of addressing contacts configured to receive measurement selection commands and a second common set of measurement contacts coupled to each DUT;
one or more switch blocks for each said DUT, each said switch block including a measurement switch coupled between one of the terminals and one of the measurement contacts; and
an addressing circuit that couples the first common set of addressing contacts to each of the DUT switch blocks, said switch blocks responsive to said measurement selection commands to simultaneously test a plurality of DUTs and read out serially one or more measurement signals for the tested DUTs at the one or more of the measurement contacts that characterize the unqualified IC fabrication process, wherein said one or more measurement signals for each tested DUT indicative of the performance of only that tested DUT independent of the other simultaneously tested DUTs.

24. The programmable test structure of claim 23, wherein said plurality of contacts, said one or more switch blocks for each said DUT and said addressing circuit are integrated on said one or more test device die.

25. The programmable test structure of claim 23, wherein said one or more switch blocks and said addressing circuit are fabricated on one or more test circuit die with a different and qualified IC fabrication process than used to fabricate the DUTs for said test device die.

26. The programmable test structure of claim 23, further comprising a third common set of stress contacts, each said switch block including a stress switch coupled between the terminal and one of the stress contacts, said addressing circuit responsive to the measurement selection commands to close the stress switches for a first group of DUTs to couple the addressing contacts in the third common set to the DUT terminal to apply first bias conditions to simultaneously stress the DUTs in the first group, said addressing circuit responsive to the measurement selection commands to open the stress switches and close the measurement switches for the first group of DUTs one DUT at a time to read out serially the one or more measurement signals.

* * * * *

UNITED STATES PATENT AND TRADEMARK OFFICE
CERTIFICATE OF CORRECTION

PATENT NO. : 10,082,535 B2
APPLICATION NO. : 15/008868
DATED : September 25, 2018
INVENTOR(S) : Esko O. Mikkola et al.

Page 1 of 1

It is certified that error appears in the above-identified patent and that said Letters Patent is hereby corrected as shown below:

On the Title Page

Applicant and Inventor Mikkola's city should be "Tucson" instead of "Tuscon."

Signed and Sealed this
Twentieth Day of November, 2018

Andrei Iancu
*Director of the United States Patent and Trademark Office*